(12) United States Patent
Hong et al.

(10) Patent No.: US 12,057,448 B2
(45) Date of Patent: Aug. 6, 2024

(54) STACKED SEMICONDUCTOR DEVICE HAVING MIRROR-SYMMETRIC PATTERN

(71) Applicant: SAMSUNG ELECTRONICS CO., LTD., Suwon-si (KR)

(72) Inventors: Byounghak Hong, Albany, NY (US); Seunghyun Song, Albany, NY (US); Hwichan Jun, Albany, NY (US); Inchan Hwang, Schenectady, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/356,545

(22) Filed: Jul. 21, 2023

(65) Prior Publication Data
US 2023/0369317 A1    Nov. 16, 2023

Related U.S. Application Data

(63) Continuation of application No. 17/223,829, filed on Apr. 6, 2021, now Pat. No. 11,735,585.

(Continued)

(51) Int. Cl.
| | | |
|---|---|---|
| H01L 21/822 | (2006.01) | |
| H01L 21/8234 | (2006.01) | |
| H01L 21/8238 | (2006.01) | |
| H01L 27/06 | (2006.01) | |
| H01L 27/092 | (2006.01) | |
| H01L 29/66 | (2006.01) | |

(52) U.S. Cl.
CPC ...... H01L 27/0688 (2013.01); H01L 21/8221 (2013.01); H01L 21/823437 (2013.01);

(Continued)

(58) Field of Classification Search
CPC ......... H01L 21/8221; H01L 21/823431; H01L 21/823437; H01L 21/823475;
(Continued)

(56) References Cited

U.S. PATENT DOCUMENTS 9,613,844 B2   4/2017   Or-Bach et al.
9,627,270 B2   4/2017   Cheng et al.
(Continued)

FOREIGN PATENT DOCUMENTS

EP    3675158 A2      7/2020
WO    2016204755 A1   12/2016

OTHER PUBLICATIONS

Communication dated Mar. 1, 2022 issued by the European Patent Office in application No. 21199064.3.
(Continued)

*Primary Examiner* — Michael M Trinh
(74) *Attorney, Agent, or Firm* — Sughrue Mion, PLLC

(57) ABSTRACT

A stacked semiconductor device includes: a substrate; a $1^{st}$ transistor formed on a substrate, and including a $1^{st}$ active region surrounded by a $1^{st}$ gate structure and $1^{st}$ source/drain regions; and a $2^{nd}$ transistor stacked on the $1^{st}$ transistor, and including a $2^{nd}$ active region surrounded by a $2^{nd}$ gate structure and $2^{nd}$ source/drain regions, wherein the $1^{st}$ active region and the $1^{st}$ gate structure are vertically mirror-symmetric to the $2^{nd}$ active region and the $2^{nd}$ gate structure, respectively, with respect to a virtual plane therebetween.

4 Claims, 23 Drawing Sheets

Related U.S. Application Data

(60) Provisional application No. 63/138,594, filed on Jan. 18, 2021.

(52) U.S. Cl.
CPC .............. H01L 21/823487 (2013.01); H01L 21/823828 (2013.01); H01L 21/823885 (2013.01); H01L 27/0922 (2013.01); H01L 29/66545 (2013.01)

(58) Field of Classification Search
CPC ..... H01L 21/823821; H01L 21/823842; H01L 21/823871; H01L 21/823885; H01L 21/823487; H01L 21/823828; H01L 27/0688; H01L 27/088; H01L 27/092; H01L 27/0924; H01L 29/66545
See application file for complete search history.

(56) References Cited

U.S. PATENT DOCUMENTS

| | | | |
|---|---|---|---|
| 9,837,414 | B1 | 12/2017 | Balakrishnan et al. |
| 10,205,018 | B1* | 2/2019 | Li ...................... H01L 29/78621 |
| 10,236,292 | B1 | 3/2019 | Frougier et al. |
| 10,420,171 | B2 | 9/2019 | Goktepeli |
| 2012/0248544 | A1 | 10/2012 | Yokoyama |
| 2015/0348945 | A1* | 12/2015 | Or-Bach ................ H10B 43/20 |
| | | | 257/384 |
| 2016/0043108 | A1 | 2/2016 | Fanelli |
| 2018/0315838 | A1 | 11/2018 | Morrow et al. |
| 2019/0319095 | A1 | 10/2019 | Zhang et al. |
| 2019/0326175 | A1 | 10/2019 | Lilak et al. |
| 2020/0006331 | A1 | 1/2020 | Lilak et al. |
| 2020/0105751 | A1* | 4/2020 | Dewey ................ H01L 21/8256 |
| 2020/0118891 | A1 | 4/2020 | Cheng et al. |
| 2020/0119015 | A1 | 4/2020 | Bi et al. |
| 2020/0219979 | A1 | 7/2020 | Rachmady et al. |
| 2020/0403034 | A1 | 12/2020 | Ando et al. |
| 2021/0035975 | A1* | 2/2021 | Kim .................. H01L 29/78684 |
| 2021/0391207 | A1 | 12/2021 | Gardner et al. |
| 2021/0407999 | A1* | 12/2021 | Huang ............ H01L 21/823878 |
| 2022/0123128 | A1* | 4/2022 | Morrow .......... H01L 21/823871 |

OTHER PUBLICATIONS

Communication issued May 17, 2024 by the State Intellectual Property Office, PRC in Chinese Patent Application No. 202111570992.8.

* cited by examiner

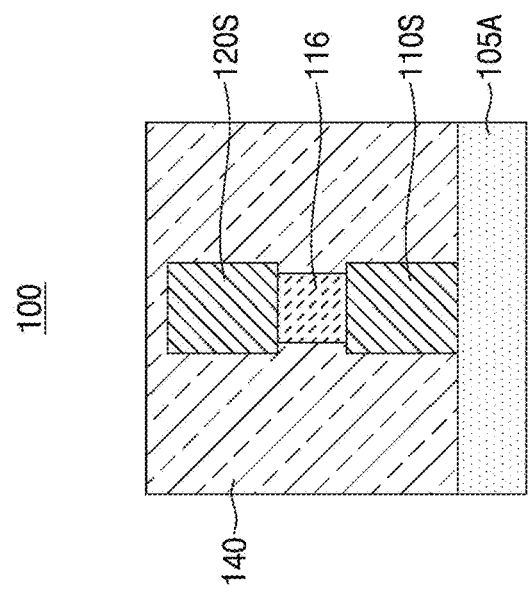
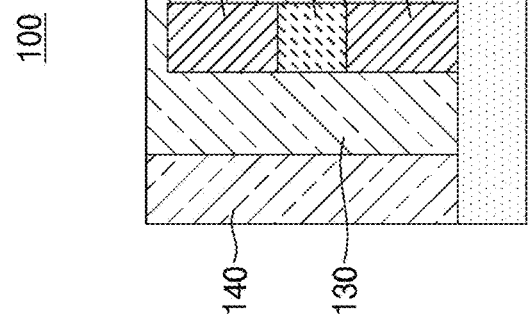
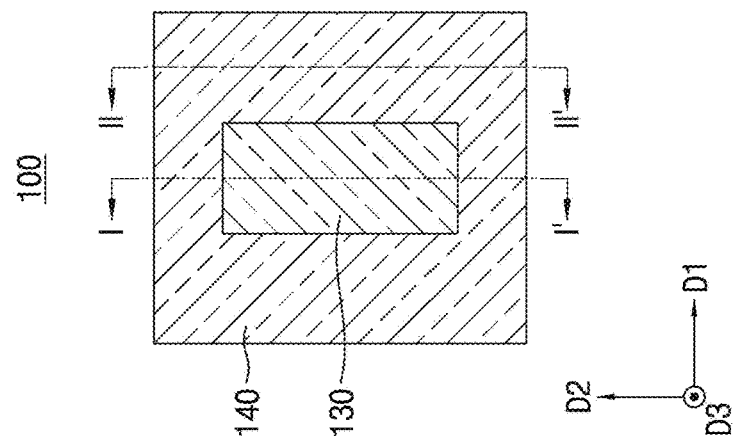

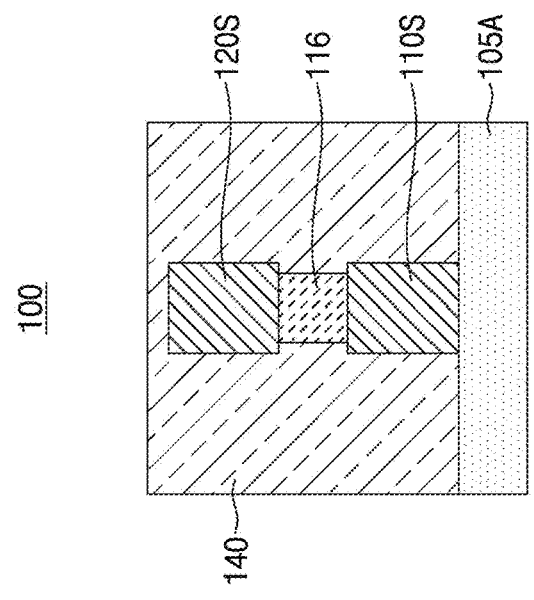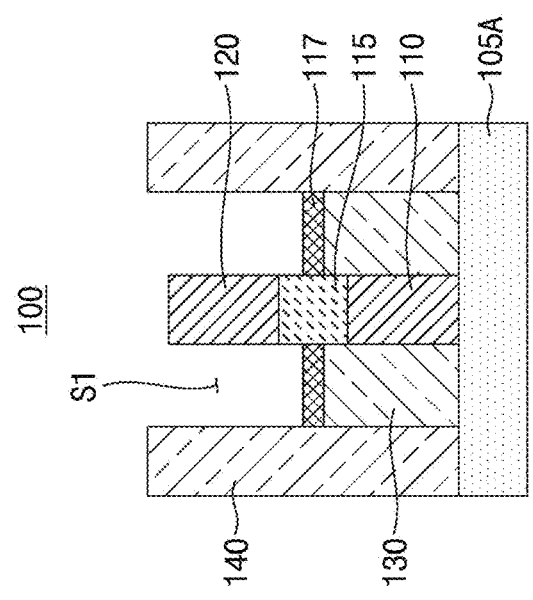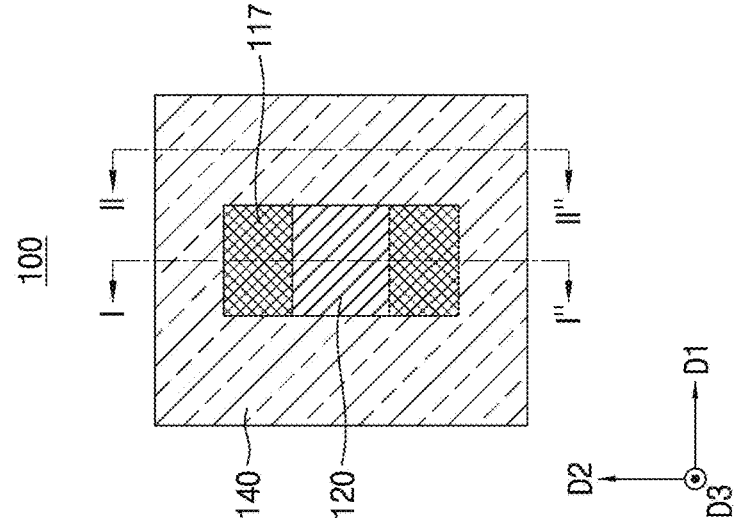

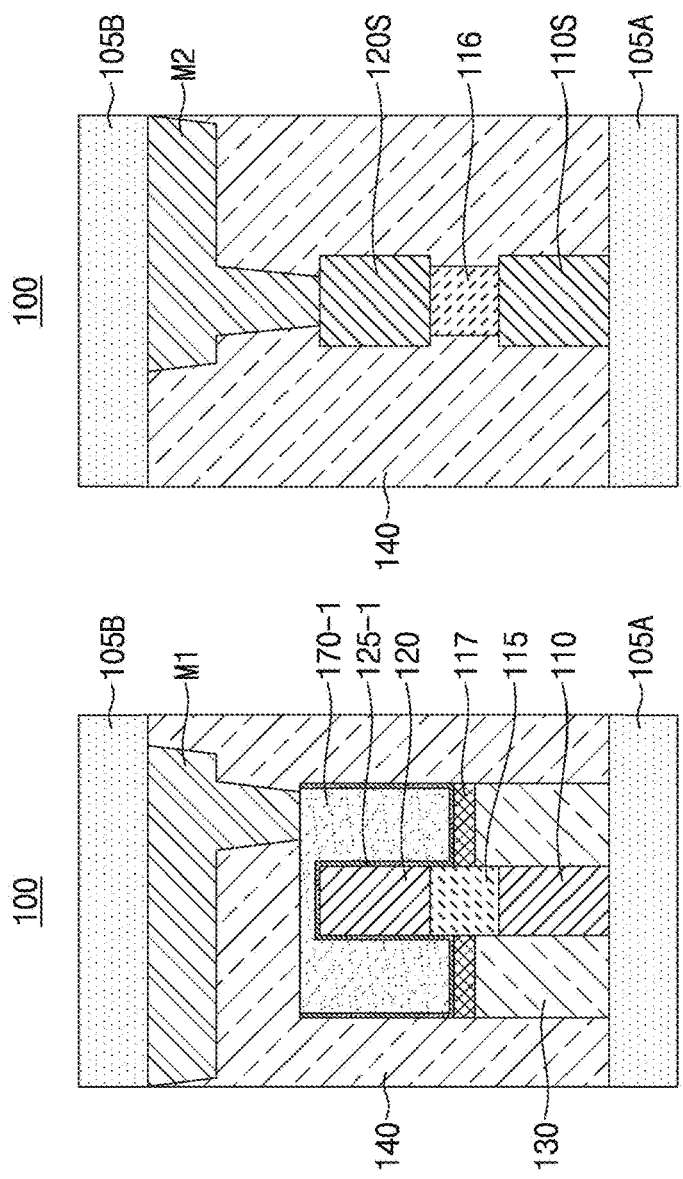

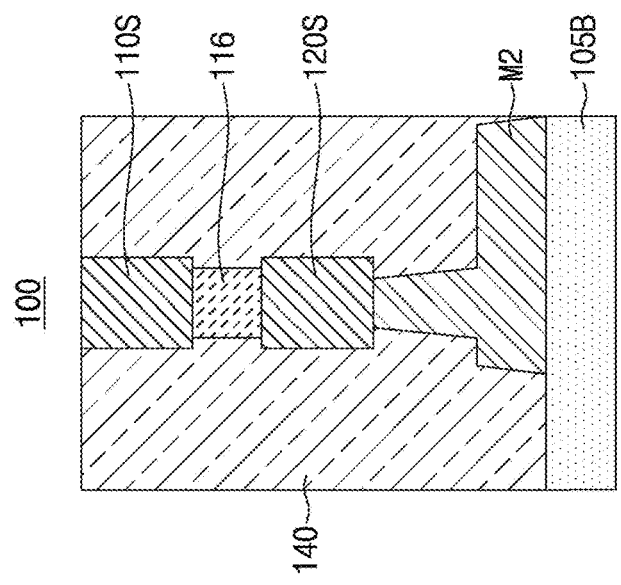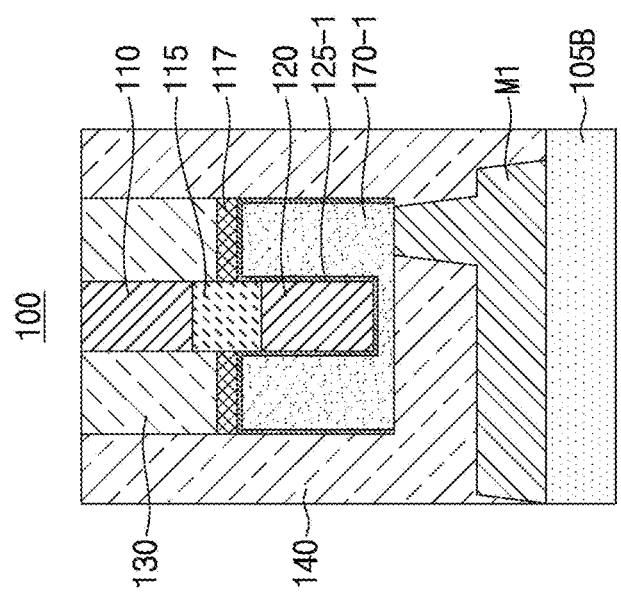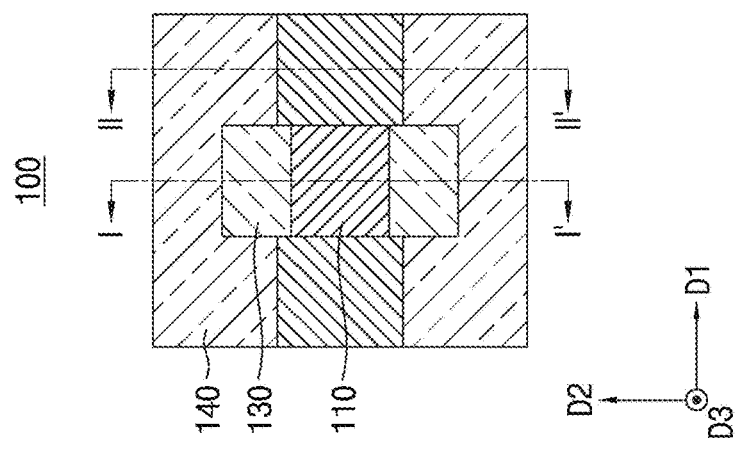

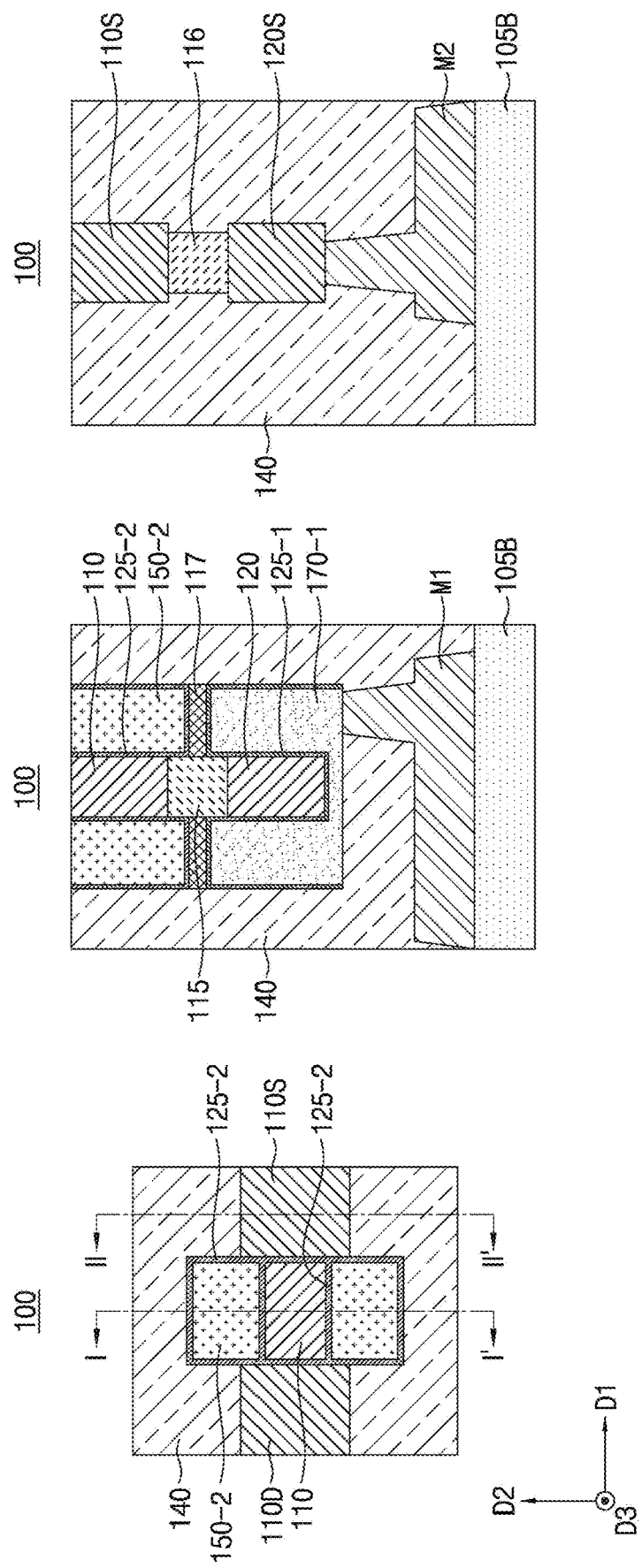

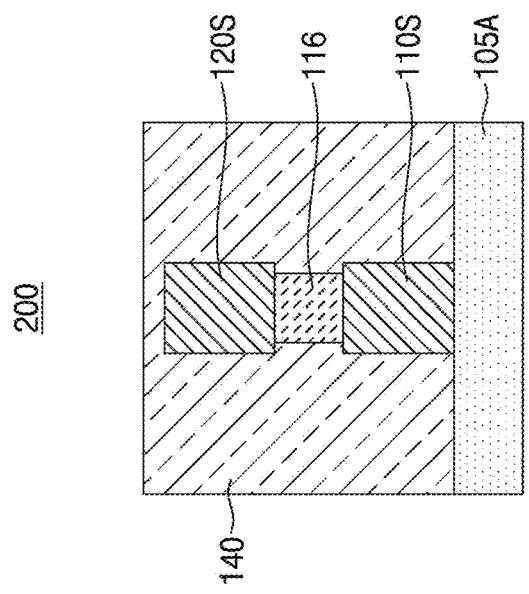
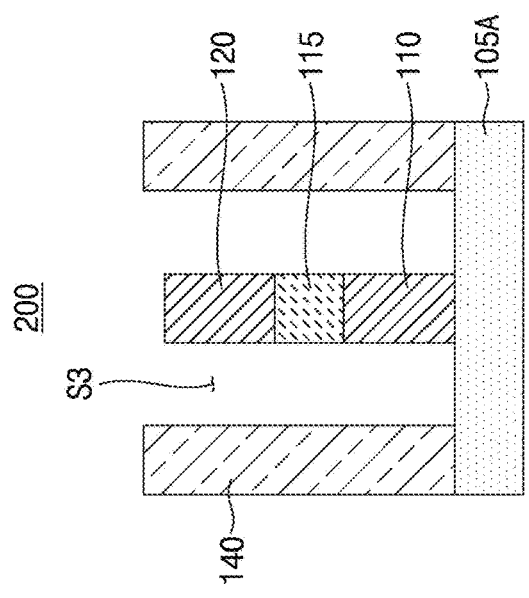
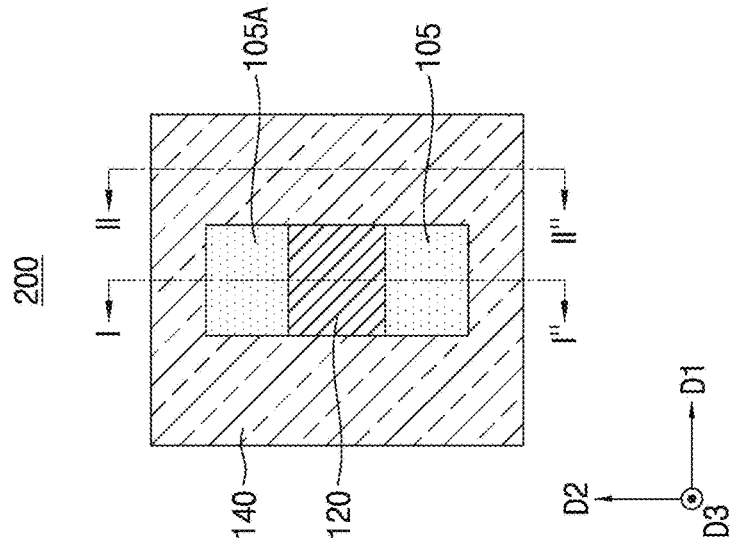

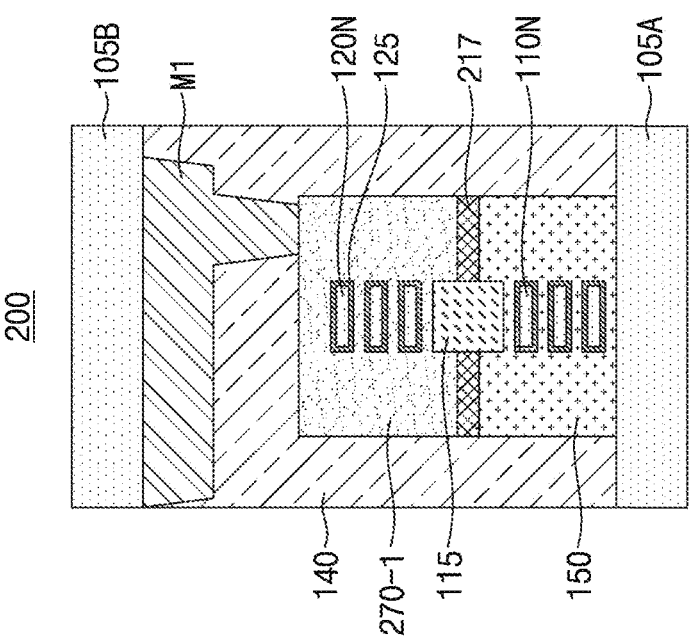

US 12,057,448 B2

STACKED SEMICONDUCTOR DEVICE HAVING MIRROR-SYMMETRIC PATTERN

CROSS-REFERENCE TO THE RELATED APPLICATION

This is a continuation of U.S. application Ser. No. 17/223,829 filed Apr. 6, 2021, which application is based on and claims priority from U.S. Provisional Application No. 63/138,594 filed on Jan. 18, 2021 in the U.S. Patent and Trademark Office, the disclosure of which is incorporated herein in its entirety by reference.

BACKGROUND

1. Field

Apparatuses and methods consistent with example embodiments of the inventive concept relate to a stacked semiconductor device and, more particularly, to a structure of a stacked semiconductor device with a mirror symmetric structure.

2. Description of the Related Art

Growing demand for miniaturization of a semiconductor device introduced a fin field-effect transistor (finFET), and further, a nanosheet transistor, which is also referred to as a multi-bridge channel FET (MBCFET), beyond a planar-structured transistor. Both the finFET and the nanosheet transistor are known as a gate-all-around transistor because their structures provided for a current channel are wrapped or surrounded by a gate structure.

In an effort to concentrate semiconductor devices including the finFETs or nanosheet transistors driving a more current amount in a limited layout area, a three-dimensional stacked device structure has been studied. However, simple stacking or layering of two semiconductor devices may not reduce an area by 50% at least because of middle-of-the-line (MOL) structures that connect a lower-stack transistor with an upper stack transistor directly or indirectly. These MOL structures include a top epi contact structure (CA) of the lower-stack transistor, a bottom epi contact structure (CR) of the upper-stack transistor, a gate contact structure (CB) of the lower-stack transistor, and a gate pattern contact structure (CS) of the upper-stack transistor.

SUMMARY

The disclosure provides a stacked semiconductor device having a mirror-symmetric structure, and methods of manufacturing the same.

According to embodiments, there is provided a stacked semiconductor device that may include: a substrate; a $1^{st}$ transistor formed on a substrate, and including a $1^{st}$ active region surrounded by a $1^{st}$ gate structure and $1^{st}$ source/drain regions; and a $2^{nd}$ transistor stacked on the $1^{st}$ transistor, and including a $2^{nd}$ active region surrounded by a $2^{nd}$ gate structure and $2^{nd}$ source/drain regions, wherein the $1^{st}$ active region and the $1^{st}$ gate structure are vertically mirror-symmetric to the $2^{nd}$ active region and the $2^{nd}$ gate structure, respectively, with respect to a virtual plane therebetween.

According to embodiments, there is provided a method of manufacturing a stacked semiconductor device. The method may include: providing a stacked semiconductor device comprising a $1^{st}$ substrate, a $1^{st}$ active region and $1^{st}$ source/drain regions on the $1^{st}$ substrate, and a $2^{nd}$ active region and $2^{nd}$ source/drain regions above the $1^{st}$ active region and the $1^{st}$ source/drain regions, respectively; forming a dummy gate structure surrounding the $1^{st}$ active region and the $2^{nd}$ active region; replacing an upper portion of the dummy gate structure with a $1^{st}$ gate dielectric layer, layered on outer surfaces of the $2^{nd}$ active region, and a $1^{st}$ replacement metal gate (RMG) structure to form a $1^{st}$ gate structure, thereby forming a lower-stack transistor; forming a $2^{nd}$ substrate above the stacked semiconductor device; flipping the stacked semiconductor device with the $2^{nd}$ substrate thereabove upside down so that a remaining portion of the dummy gate structure is disposed above the $1^{st}$ gate structure; removing the $1^{st}$ substrate; replacing the remaining dummy gate structure with a $2^{nd}$ gate dielectric layer, layered on outer surfaces of the $1^{st}$ active region, and a $2^{nd}$ RMG structure to form a $2^{nd}$ gate structure, thereby forming an upper-stack transistor.

According to embodiments, there is provided a method of manufacturing a stacked semiconductor device. The method may include: providing a stacked semiconductor device comprising a $1^{st}$ substrate, a $1^{st}$ active region and $1^{st}$ source/drain regions on the $1^{st}$ substrate, and a $2^{nd}$ active region and $2^{nd}$ source/drain regions above the $1^{st}$ active region and the $1^{st}$ source/drain regions, respectively; forming a dummy gate structure surrounding the $1^{st}$ active region and the $2^{nd}$ active region; replacing the dummy gate structure with a gate dielectric layer, layered on outer surfaces of at least the $1^{st}$ active region and the $2^{nd}$ active region, and a $1^{st}$ RPG structure; replacing an upper portion of the RPG structure with a $1^{st}$ RMG structure to form a $1^{st}$ gate structure, thereby forming a lower-stack transistor; forming a $2^{nd}$ substrate above the stacked semiconductor device; flipping the stacked semiconductor device with the $2^{nd}$ substrate thereabove upside down so that a remaining portion of the RPG structure is disposed above the $1^{st}$ gate structure; removing the $1^{st}$ substrate; replacing the remaining RPG structure with a $2^{nd}$ RMG structure to form a $2^{nd}$ gate structure, thereby forming an upper-stack transistor.

BRIEF DESCRIPTION OF THE DRAWINGS

Example embodiments of the inventive concept will be more clearly understood from the following detailed description taken in conjunction with the accompanying drawings in which:

FIGS. 11A to 11C through 16A to 16D illustrate a method of manufacturing a stacked semiconductor device, according to embodiments;

DETAILED DESCRIPTION OF THE EMBODIMENTS

Figure 1C:
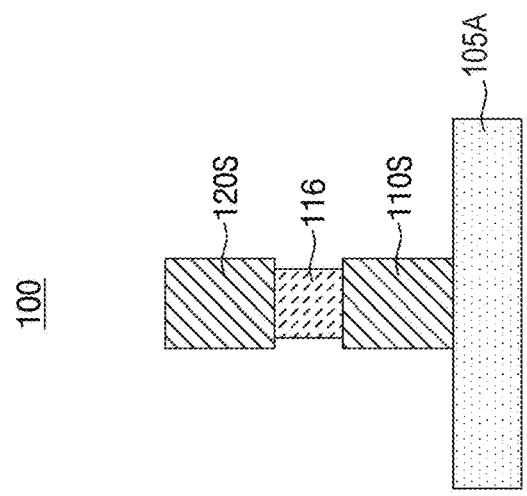
FIGS. 1A to 1C through 10A to 10C illustrate a method of manufacturing a stacked semiconductor device, according to embodiments.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a metal oxide semiconductor described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including finFETs and nanosheet transistors may or may not be described in detail herein. In the drawings, the reference numbers indicating the same elements in different drawings may be omitted in one or more of the drawings for brevity.

Herebelow, a method of manufacturing a stacked semiconductor device achieving a more area gain is described.

FIGS. 1A to 1C through 10A to 10C illustrate a method of manufacturing a stacked semiconductor device, according to embodiments. In these drawings, FIGS. 1A to 10A illustrate respective top plan views of a stacked semiconductor device in each step, FIGS. 1B to 10B illustrate respective cross-section views of the stacked semiconductor device of FIGS. 1A to 10A taken along lines I-I' thereof, respectively, and FIGS. 1C to 10C illustrate respective cross-section views of the stacked semiconductor device of FIGS. 1A to 10A taken along a line II-IF thereof, respectively, according to embodiments.

Figure 1B:
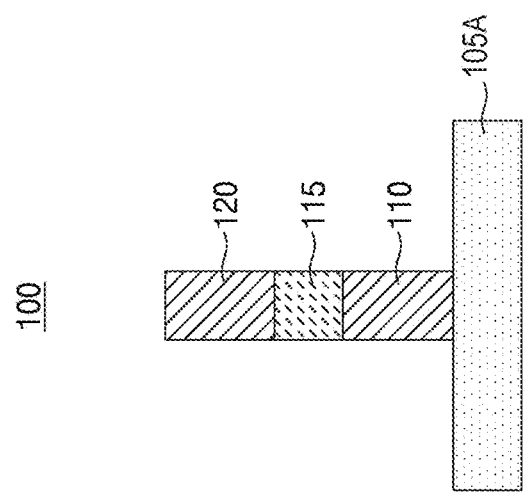
Figure 1A:
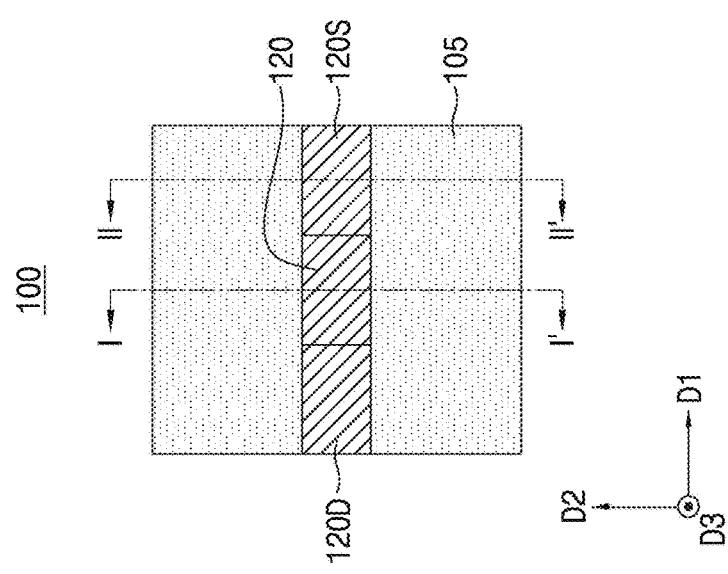

Referring to FIGS. 1A to 1C, a stacked semiconductor device 100 includes a $1^{st}$ substrate 105A on which a $1^{st}$ active region 110 and a $2^{nd}$ active region 120 are stacked in a D3 direction which is perpendicular to a top surface of the substrate 105A. Between the $1^{st}$ active region 110 and the $2^{nd}$ active region 120 is formed a $1^{st}$ isolation layer 115 which isolates the $2^{nd}$ active region from the $1^{st}$ active region 110.

The $1^{st}$ substrate 105A may be a bulk substrate of a semiconductor material, for example, silicon (Si), silicon germanium (SiGe), a Si-on-insulator, a SiGe-on-insulator, doped or undoped with impurities. Each of the $1^{st}$ active region 110 and the $2^{nd}$ active region 120 may be one or more fin structures which are to form a single or multi-channel of a transistor extended in a D1 direction when completed. For example, the fin structures of each of the two active regions 110 and 120 may be a plurality of nanosheet layers to form a nanosheet transistor or a plurality vertical fin structures to form a finFET. Here, the D1 direction is a channel length direction perpendicular to a D2 direction which is a channel width direction.

The $1^{st}$ active region 110 and the $2^{nd}$ active region 120 may be both epitaxially grown from the $1^{st}$ substrate 105A to have the same crystalline characteristics as the semiconductor material of the $1^{st}$ substrate 105A. According to an embodiment, there may be formed an isolation layer (not shown) between the $1^{st}$ active region and the $1^{st}$ substrate 105A to isolate the $1^{st}$ active region from the $1^{st}$ substrate 105A. The $1^{st}$ isolation layer 115 may also be epitaxially grown from the $1^{st}$ substrate 105A except that it includes a different material from the $1^{st}$ active region 110 and the $2^{nd}$ active region 120 in terms of material concentration, temperature, processing time, etc. For example, the isolation layer 115 may include a higher concentration of germanium (Ge) than the two active regions 110 and 120 when each of the two active regions 110 and 120 is formed of a plurality of nanosheet layers. However, each of the two active regions 110 and 120 may be grown from respective substrates separately, and bonded to form the stacked structure as shown in FIGS. 1A to 1C. Also, according to an embodiment, the $1^{st}$ isolation layer 115 may also be separately formed and include a dielectric material such as silicon oxide (SiO) and its equivalent, according to an embodiment.

FIGS. 1A and 1C also show that $1^{st}$ source/drain regions 110S and 110D (not shown) are formed at both ends of the $1^{st}$ active region 110 in a channel length direction, and $2^{nd}$ source/drain regions 120S and 120D are formed at both ends of the $2^{nd}$ active region 120. These source/drain regions may be epitaxially grown from the respective ends of the active regions 110 and 120 in the channel length direction (D1 direction), and insulated from each other by a $2^{nd}$ isolation layer 116 which may be formed of the same or similar dielectric material forming the $1^{st}$ isolation layer 115.

Referring to FIGS. 2A to 2C, the stacked semiconductor device 100 shown in FIGS. 1B and 1C is provided with a dummy gate structure 130 across the $1^{st}$ active region 110 and the $2^{nd}$ active region 120. The dummy gate structure 130 may be formed on the $1^{st}$ substrate 105A to surround or wrap the two active regions 110 and 120 when viewed in the D1 direction (channel length direction). Outside the dummy gate structure 130 is formed an interlayer dielectric (ILD) layer 140 as shown in FIG. 2A. This ILD layer 140 may also encompass the $1^{st}$ source/drain regions 110S and 110D and $2^{nd}$ source/drain regions 120s and 120D when viewed in the D1 direction. The ILD layer 140 may be provide to isolate the stacked semiconductor device 100 from another stacked semiconductor device or circuit element, The dummy gate structure 130 may be formed by lithography and etching operations, and may include amorphous silicon, amorphous carbon, diamond-like carbon, dielectric metal oxide, and/or silicon nitride, not being limited thereto. The ILD layer 140 may be formed by chemical vapor deposition (CVD) or physical vapor deposition (PVD), not being limited thereto to include an oxide material in bulk (e.g., silicon dioxide having a low-κ dielectric).

Referring to FIGS. 3A to 3C, an upper portion of the dummy gate structure 130 surrounding the $1^{st}$ active region 110 is removed to form a $1^{st}$ void space S1 in the stacked semiconductor device 100, for example, by a dry etching, a wet etching, a reactive ion etching (RIE) and/or a chemical oxide removal (COR) process. Then, a $3^{rd}$ isolation layer 117 is formed at a bottom surface of $1^{st}$ void space S1 which is a top surface of a remaining portion of the dummy gate structure 130 which remains after the upper portion thereof is removed. Here, the upper portion of the dummy gate structure 130 is removed such that the $3^{rd}$ isolation layer 117 formed on the top surface of the remaining portion of the dummy gate structure 130 is layered at a level corresponding to a vertical middle section of the $1^{st}$ isolation layer 115.

The $3^{rd}$ isolation layer 117 may be layered for isolation of two gate structures which will be formed to surround the two active regions 110 and 120, respectively, in a later step. The $3^{rd}$ isolation layer 117 may include the same or similar dielectric material forming the $1^{st}$ isolation layer 115. However, this operation of layering the $3^{rd}$ isolation layer 117 is optional, and thus, may be omitted when these two gate structures are to be connected and include the same work function materials to be discussed later.

Figure 4C:
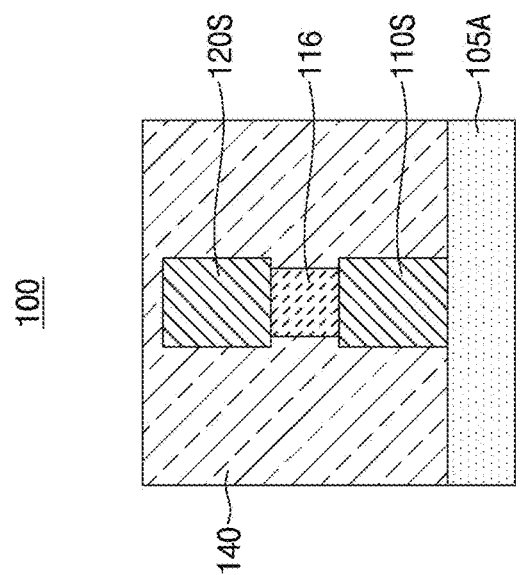
Figure 4B:
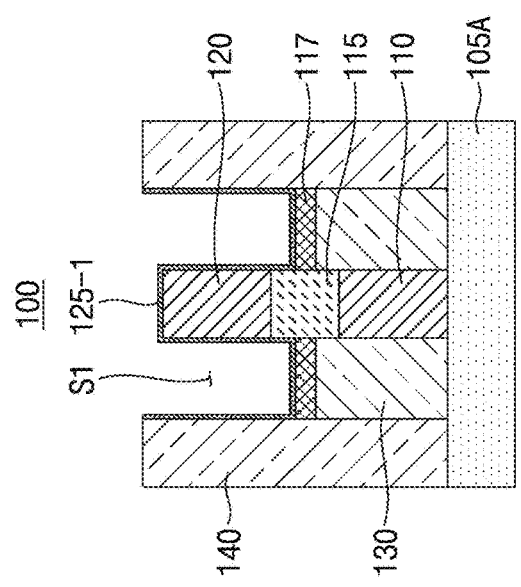
Figure 4A:
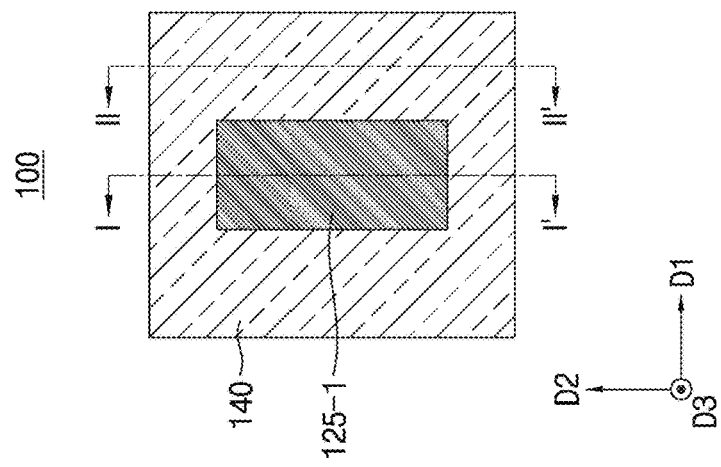

Referring to FIGS. 4A to 4C, a $1^{st}$ gate dielectric layer 125-1 is conformally formed by, for example, atomic layer deposition (ALD) along an inner surface of the $1^{st}$ void space S1. Thus, the $1^{st}$ gate dielectric layer 125-1 surrounds the $2^{nd}$ active region 120, and is layered on a top surface of the $3^{rd}$ isolation layer 117, sidewalls of the upper portion of the $1^{st}$ isolation layer 115 at a level above the top surface of the $3^{rd}$ isolation layer 117, and sidewalls of an upper portion of the ILD layer 140 at the level above the top surface of the $3^{rd}$ isolation layer 117. However, according to an embodiment, the $1^{st}$ gate dielectric layer 125-1 may not be formed on the top surface of the $3^{rd}$ isolation layer 117 shown in FIG. 4B.

The $1^{st}$ gate dielectric layer 125-1 may include at least an interfacial layer formed on the $1^{st}$ void space S1 and a high-κ dielectric layer formed on the interfacial layer. The interfacial layer may include at least one of SiO, silicon dioxide (SiO$_2$), and/or silicon oxynitride (SiON), not being limited thereto, to protect the $2^{nd}$ active region 120, facilitate growth of the high-κ dielectric layer thereon, and provide a necessary characteristic interface with the $1^{st}$ active region 110. The high-κ dielectric layer may be formed of a metal oxide material or a metal silicate such as Hf, Al, Zr, La, Mg, Ba, Ti, Pb, or a combination thereof, not being limited thereto, having a dielectric constant value greater than 7. The high-κ dielectric layer may be provided to allow an increased gate capacitance without associated current leakage at a gate structure to be formed later.

Figure 5C:
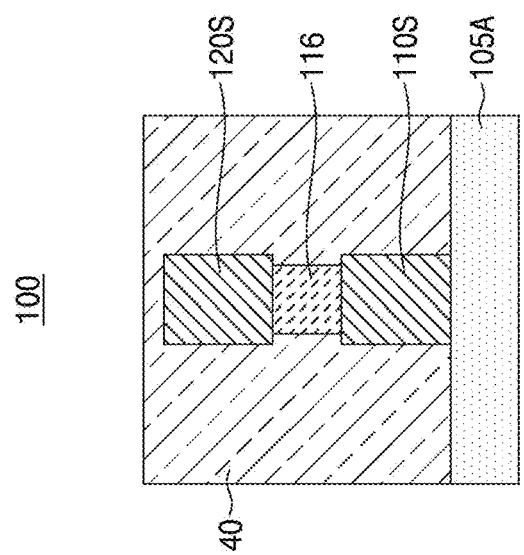
Figure 5B:
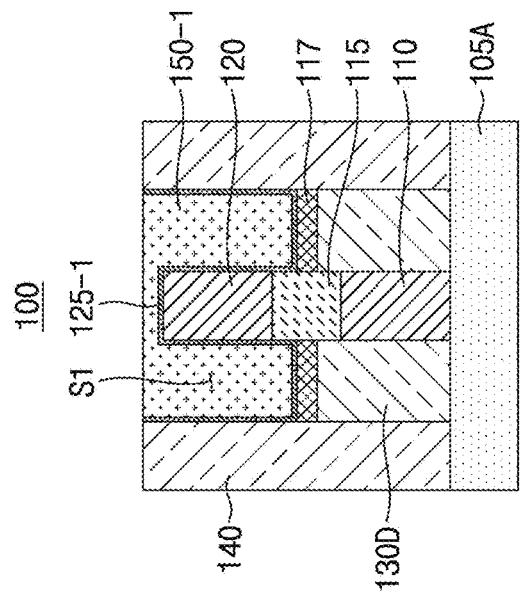
Figure 5A:
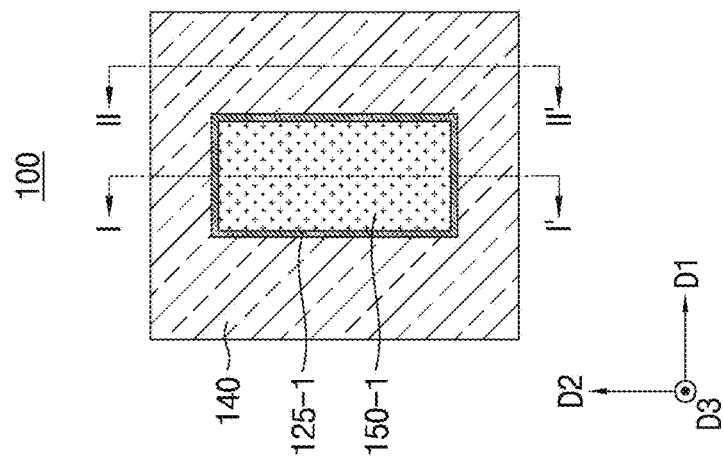

Referring to FIGS. 5A to 5C, a $1^{st}$ replacement polysilicon gate (RPG) structure 150-1 is filled in the $1^{st}$ void space S1 in which the $1^{st}$ gate dielectric layer 125-1 is layered as shown in FIG. 4B. Thus, the $1^{st}$ RPG structure 150-1 takes a shape of surrounding at least the $2^{nd}$ active region 120. The $1^{st}$ RPG structure 150-1 is formed for the purpose of annealing the $1^{st}$ gate dielectric layer 125-1 to increase reliability of the $1^{st}$ gate dielectric layer 125-1 in its functions described above. However, this process of RPG structure formation may be optional, and thus, may be omitted, according to an embodiment.

Referring to FIGS. 6A to 6C, the $1^{st}$ RPG structure 150-1 after annealing the $1^{st}$ gate dielectric layer 125-1 is removed from the $1^{st}$ void space S1 by, for example, a dry etching, wet etching, RIE and/or COR process, and instead, a $1^{st}$ replacement metal gate (RMG) structure is filled in the $1^{st}$ void space S1 to form a $1^{st}$ gate structure 170-1 surrounding at least the $2^{nd}$ active region 120 covered by the $1^{st}$ gate dielectric layer 125-1. The $1^{st}$ RMG structure may include a work function metal (WFM) such as Cu, Al, Ti, Ta, W, Co, TiN, WN, TiAl, TiAlN, TaN, TiC, TaC, TiAlC, TaCN, TaSiN, and/or a combination thereof, not being limited thereto.

For connection of a transistor formed of the $2^{nd}$ active region 120 and the $2^{nd}$ source/drain regions with another circuit element, a $1^{st}$ metal pattern M1 and a $2^{nd}$ metal pattern M2 may be formed above the $1^{st}$ gate structure 170-1 and the $2^{nd}$ source/drain region 120S, respectively. Further, a $2^{nd}$ substrate 105B may be formed above these metal pattern M1 and M2. This wafer bonding of the $2^{nd}$ substrate may be performed at least to physically support the stacked semiconductor device 100 after the stacked semiconductor device 100 shown in FIGS. 6A to 6C is flipped upside down in a next step.

The $1^{st}$ metal pattern M1 may include a gate contact structure (CB) which may be used to receive and transmit a gate input signal to the $1^{st}$ gate structure 170-1. The $2^{nd}$ metal pattern M2 may include a source/drain contact structure (CA) which may be used to receive and transmit a power signal to the $2^{nd}$ source/drain region 120S, or output a signal from the $2^{nd}$ source/drain region 120S for internal signal routing. In addition, an additional ILD layer may be added to extend the ILD layer 140 to surround the $1^{st}$ metal pattern M1 and the $2^{nd}$ metal pattern M2.

Referring to FIGS. 7A to 7C, the stacked semiconductor device 100 shown in FIGS. 6A to 6C is flipped upside down, and the $1^{st}$ substrate 105A is removed, for example, by dry etching and/or chemical mechanical planarization (CMP) to expose a remaining portion of the dummy gate structure 130 that is not removed in the step of FIGS. 3A to 3C, the ILD layer 140 contacting the $1^{st}$ substrate 105A, and the $1^{st}$ source/drain regions 110S and 110D (not shown).

By this flipping operation, the stacked semiconductor device 100 takes a form of a device formed on the $2^{nd}$ substrate 105B, and the $2^{nd}$ active region 120 and the $2^{nd}$ source/drain regions 120S and 120D are to form a lower-stack transistor of the stacked semiconductor device 100 while the $1^{st}$ active region 110 and the $1^{st}$ source/drain regions 110S and 110D are to form an upper-stack transistor of the stacked semiconductor device 100 in a later step.

Referring to FIGS. 8A to 8C, the remaining portion of the dummy gate structure 130 shown in FIGS. 7A to 7C is removed to form a $2^{nd}$ void space (not shown) in the stacked semiconductor device 100 by a similar method used to remove the upper portion of the dummy gate structure 130 in the step of FIGS. 3A to 3C. Then, a $2^{nd}$ gate dielectric layer 125-2 is conformally formed in the $2^{nd}$ void space. Like the $1^{st}$ gate dielectric layer 125-1, the $2^{nd}$ gate dielectric layer 125-2 may also not be formed on the top surface of the $3^{rd}$ isolation layer 117 shown in FIG. 8B, according to an embodiment. The $2^{nd}$ gate dielectric layer 125-2 may include the same interfacial layer and the high-κ dielectric layer formed in the $1^{st}$ void space S1 shown in FIG. 4A to 4C. Next, a $2^{nd}$ replacement polysilicon gate (RPG) 150-2 structure is formed on the $2^{nd}$ gate dielectric layer 125-2 to fill in the $2^{nd}$ void space for annealing the $2^{nd}$ gate dielectric layer 125-1 to increase reliability thereof. As with the process of forming the $1^{st}$ RPG structure 150-1 as shown in FIGS. 5A and 5B, this process of forming the $2^{nd}$ RPG structure 150-2 is optional.

Figure 9C:
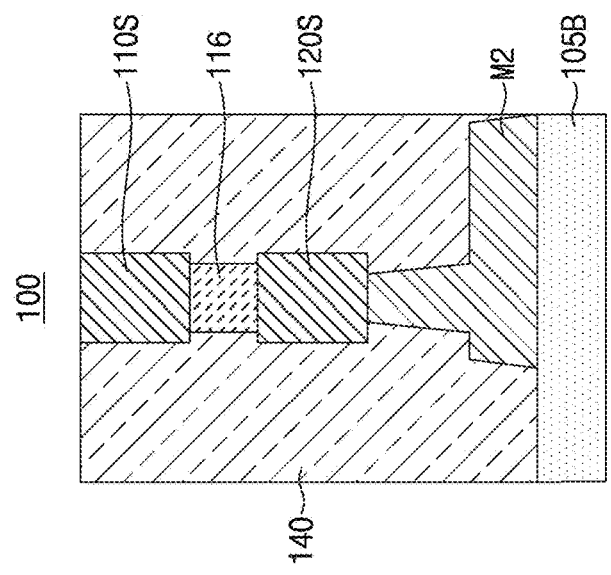
Figure 9B:
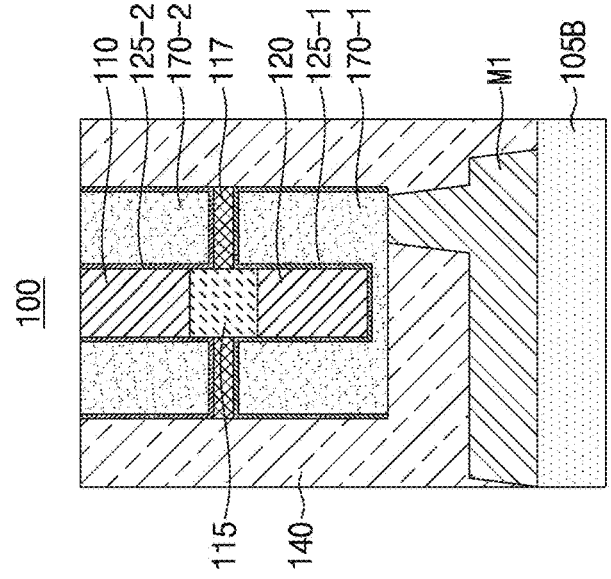
Figure 9A:
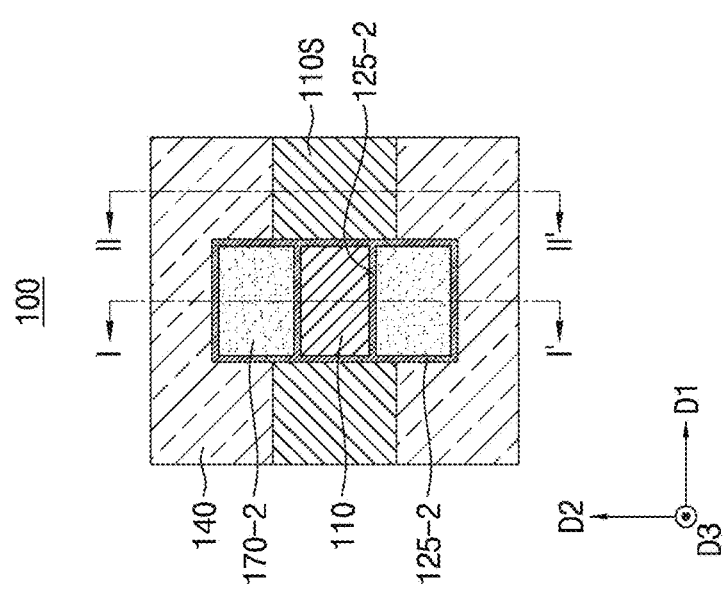

Referring to FIGS. 9A to 9C, the $2^{nd}$ RPG structure 150-2 is removed from the $2^{nd}$ void space by a similar process used to remove the $1^{st}$ RPG structure 150-1 in the step of FIGS. 6A to 6C, and a $2^{nd}$ RMG structure is formed on the $2^{nd}$ gate dielectric layer 125-2 to fill in the $2^{nd}$ void space, thereby forming a $2^{nd}$ gate structure 170-2 surrounding at least the $1^{st}$ active region 110 covered by the $2^{nd}$ gate dielectric layer 125-2. By this operation, the $2^{nd}$ gate structure 170-2 along with the $1^{st}$ source/drain regions 110S and 110D forms an upper-stack transistor of the stacked semiconductor device 100, and the $1^{st}$ gate structure 170-1 along with the $2^{nd}$ source/drain regions 120S and 120D forms a lower-stack transistor of the stacked semiconductor device 100.

The $2^{nd}$ RMG structure for the $2^{nd}$ gate structure 170-2 may include a WFM which is the same as or different that of the $1^{st}$ RMG structure including Cu, Al, Ti, Ta, W, Co, TiN, WN, TiAl, TiAlN, TaN, TiC, TaC, TiAlC, TaCN, TaSiN, and/or a combination thereof, not being limited thereto. For example, when the $1^{st}$ RMG structure and the $2^{nd}$ RMG structure are formed of the same WFM, the $1^{st}$ gate structure 170-1 and the $2^{nd}$ gate structure 170-2 both may be a common gate structure for a lower-stack transistor and an upper-stack transistor of the stacked semiconductor device 100, both of which may be a p-type or n-type metal oxide semiconductor (PMOS or NMOS). In contrast, when the $1^{st}$ RMG structure and the $2^{nd}$ RMG structure are formed of different WFMs, one of the $1^{st}$ gate structure 170-1 and the $2^{nd}$ gate structure 170-2 may form one of a PMOS and an NMOS, and the other of the two gate structures 170-1 and 170-2 may form the other of the PMOS and the NMOS.

Figure 10C:
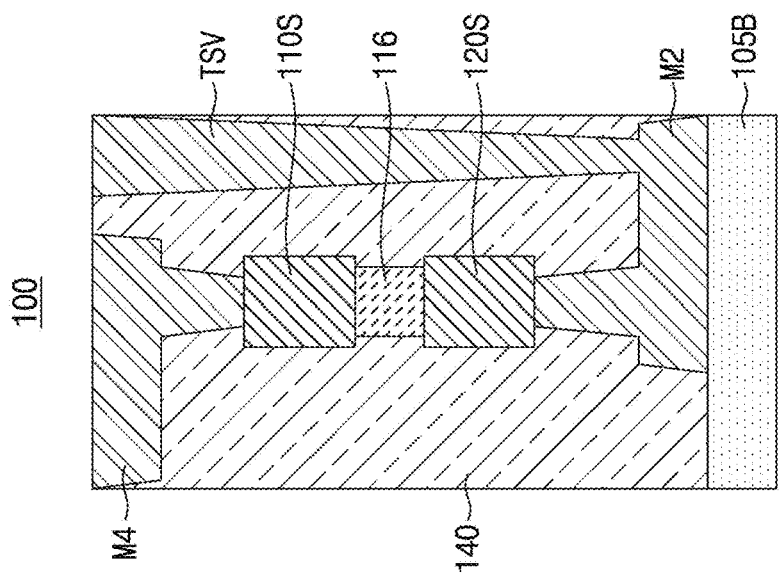
Figure 10B:
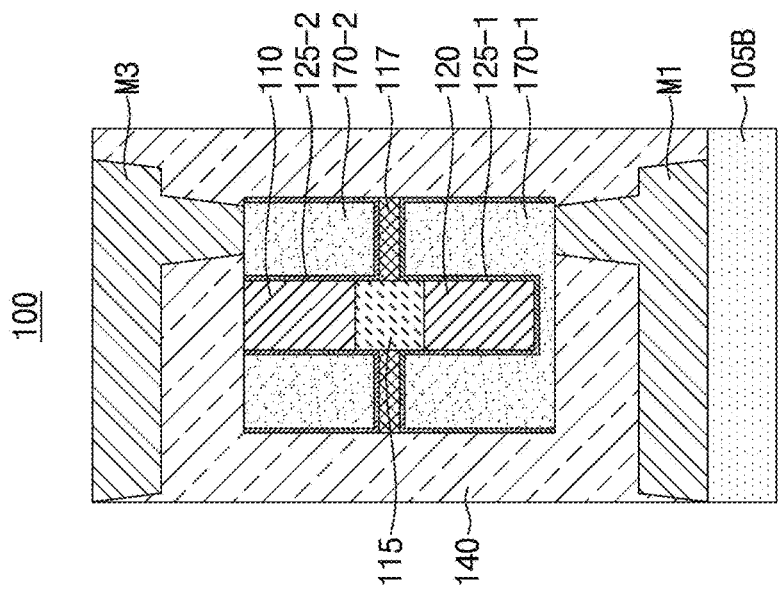
Figure 10A:
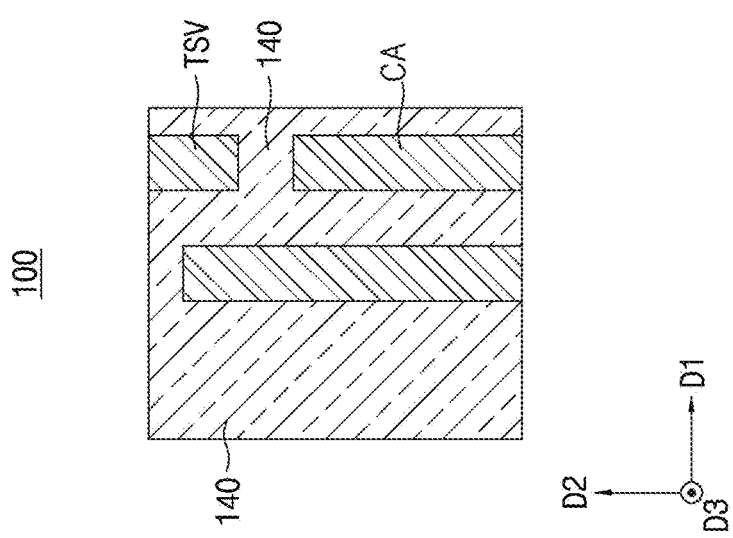

Referring to FIGS. 10A to 10C, a $3^{rd}$ metal pattern M3 and a $4^{th}$ metal pattern M4 are formed above the $2^{nd}$ gate structure 170-2 and the $1^{st}$ source/drain region 110S, respectively. It is noted here that, due to the above-described manufacturing method, the stacked semiconductor device 100 may take a form of a substantially mirror-symmetric structure in a vertical direction (D3 direction) as seen in FIG. 10B. For example, the $1^{st}$ active region 110 and the $2^{nd}$ gate structure 170-2 may be vertically mirror-symmetric to the $2^{nd}$ active region 120 and the $1^{st}$ gate structure 170-1, respectively, with respect to a virtual plane therebetween. The $3^{rd}$ metal pattern M3 may include a gate contact structure (CB) which may be used to receive and transmit a gate input signal to the $2^{nd}$ gate structure 170-2. The $4^{th}$ metal pattern may include a source/drain contact structure (CA) which may be used to receive and transmit a power signal to the $1^{st}$ source/drain region 110S, or output a signal from the $1^{st}$ source/drain region 110S for internal signal routing.

FIG. 10C further shows that a through-silicon via (TSV) is formed to penetrate the stacked semiconductor device 100, according to an embodiment. This backend-of-the-line (BEOL) structure is provided for electrical connection of the upper-stack transistor with the lower-stack transistor in the stacked semiconductor device 100, while this connection may be possible through an MOL structure in a relate art stacked semiconductor device. In addition, an additional ILD layer may be added to extend the ILD layer 140 to surround the $3^{rd}$ metal pattern M3, the $4^{th}$ metal pattern M4, and the TSV.

According to an embodiment, each of the upper-stack transistor including the $2^{nd}$ gate structure 170-2 and the lower-stack transistor including the $1^{st}$ gate structure 170-1 may be a PMOS nanosheet transistor or an NMOS nanosheet transistor. According to an embodiment, the upper-stack transistor and the lower-stack transistor may be a PMOS nanosheet transistor and an NMOS nanosheet transistor, respectively, or vice versa. According to an embodiment, each of the upper-stack transistor and the lower-stack transistor may be a p-type finFET or an n-type finFET. According to an embodiment, the upper-stack transistor and the lower-stack transistor may be a p-type finFET and an n-type finFET, respectively, or vice versa.

It is noted from the above embodiment that the stacked semiconductor device 100 may be formed to have a substantially mirror-symmetric structure in a vertical direction, in which no middle-of-the-line (MOL) structure is disposed between an upper-stack transistor and a lower-stack transistor. Thus, the stacked semiconductor device 100 according to the above embodiment may be able to achieve a substantial area gain compared to the related art stacked semiconductor device which requires an MOL structure between an upper-stack transistor and a lower-stack transistor. Further, the mirror-symmetric structure of the stacked semiconductor device may enable easy formation of lateral contact structures, backside metal interconnect structures as well as backside power rails. Moreover, there may occur no or less misalignment problems between a substrate and semiconductor elements formed thereon because of the mirror-symmetric structure of the stacked semiconductor device.

It is also noted that this mirror-symmetric structure of the stacked semiconductor device 100 according to the above embodiment may apply to a semiconductor device such as a static random access memory (SRAM) and a core which has a repetitive pattern of structure.

Figure 15C:
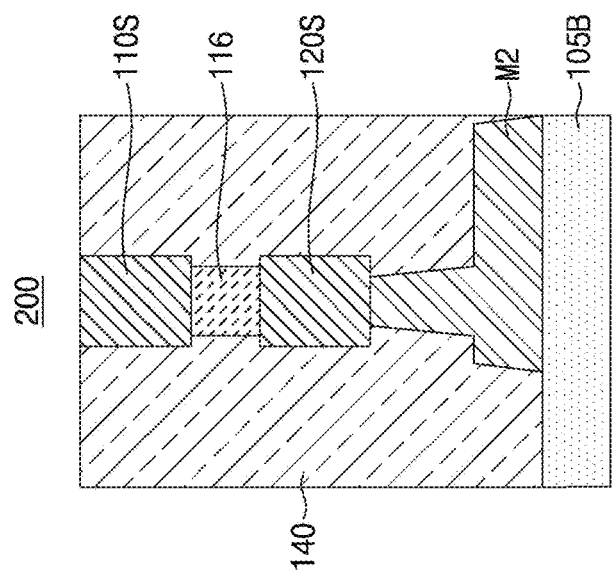
Figure 15B:
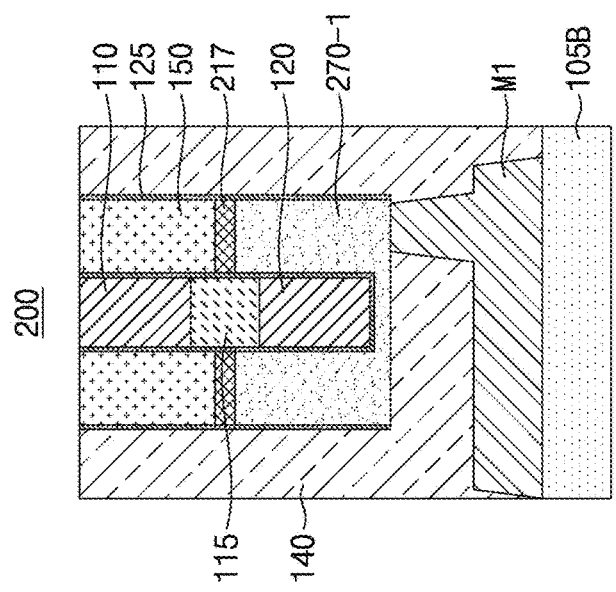
Figure 15A:
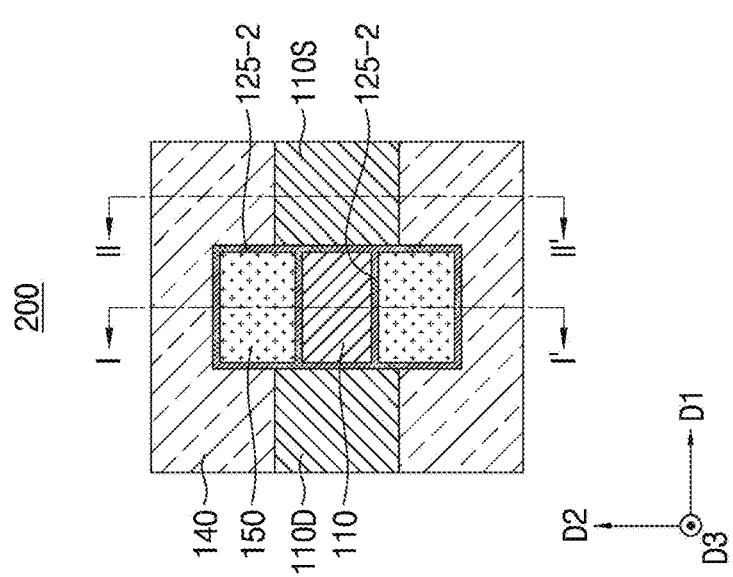
Figure 15D:
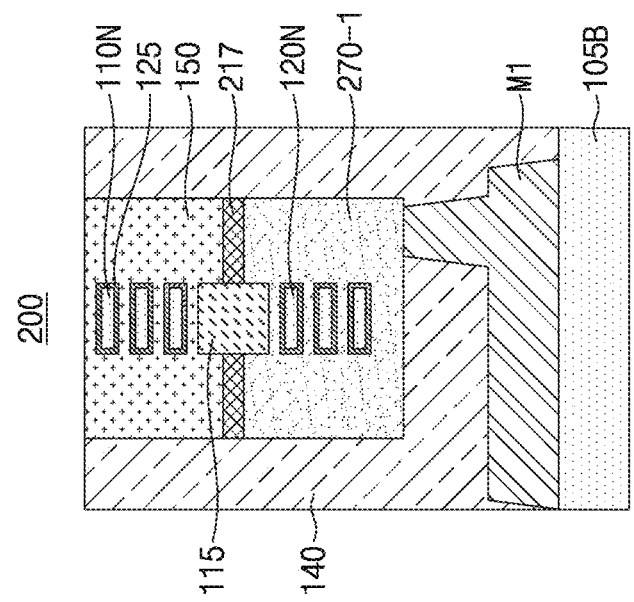
Figure 16C:
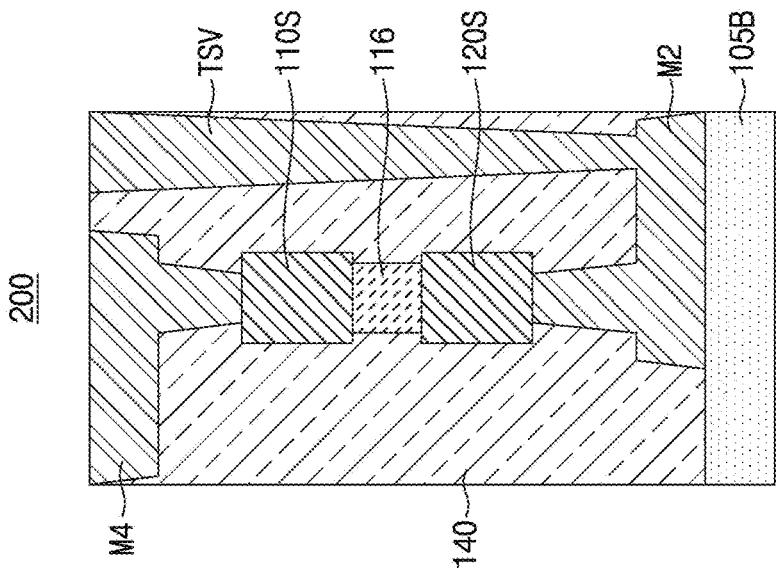
Figure 16B:
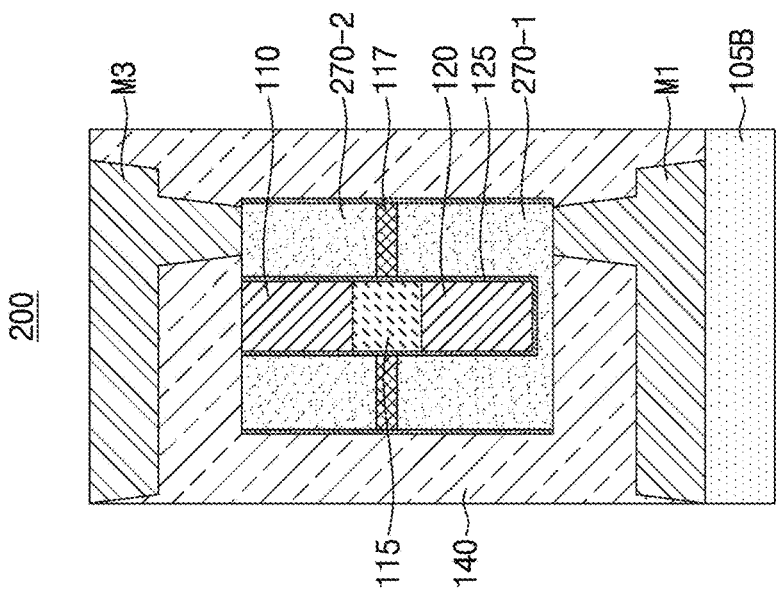

FIGS. 11A to 11C through 16A to 16C illustrate an alternative method of manufacturing a stacked semiconductor device, according to embodiments. In these drawings, FIGS. 11A to 16A illustrate respective top plan views of a stacked semiconductor device in each step, FIGS. 16 to 16B illustrate respective cross-section views of the stacked semiconductor device of FIGS. 16A to 16A taken along lines I-I' thereof, respectively, and FIGS. 16C to 16C illustrate respective cross-section views of the stacked semiconductor device of FIGS. 16A to 16A taken along a line II-IF thereof, respectively, according to embodiments.

The method of this embodiment has the same steps of FIGS. 1A to 1C and FIGS. 2A to 2C to form a stacked semiconductor device 200, and thus, duplicate descriptions thereof are omitted, and descriptions directed to only this method begin in reference to FIGS. 11A to 11C as below.

Referring to FIGS. 11A to 11C, the dummy gate structure 130 surrounding the $1^{st}$ active region 110 and the $2^{nd}$ active region 120 with the $1^{st}$ isolation layer 115 therebetween is entirely removed to form a $3^{rd}$ void space S3 in the stacked semiconductor device 200, for example, by a dry etching, a wet etching, a reactive ion etching (RIE) and/or a chemical oxide removal (COR) process.

In the previous embodiment as shown in FIGS. 3A to 3C, only the upper portion of the dummy gate structure 130 is removed to form the $1^{st}$ void space S1 above the remaining portion of the dummy gate structure 130 in the stacked semiconductor device 100. In the present embodiment, however, the dummy gate structure 130 is removed in its entirety to expose the $1^{st}$ substrate 105A in the $3^{rd}$ void space S3 formed in the stacked semiconductor device 200 as shown in FIG. 11B. This difference is intended to enable one time formation of a gate dielectric layer covering both the $1^{st}$ active region 110 and the $2^{nd}$ active region 120 in a later step to be described below.

Figure 12C:
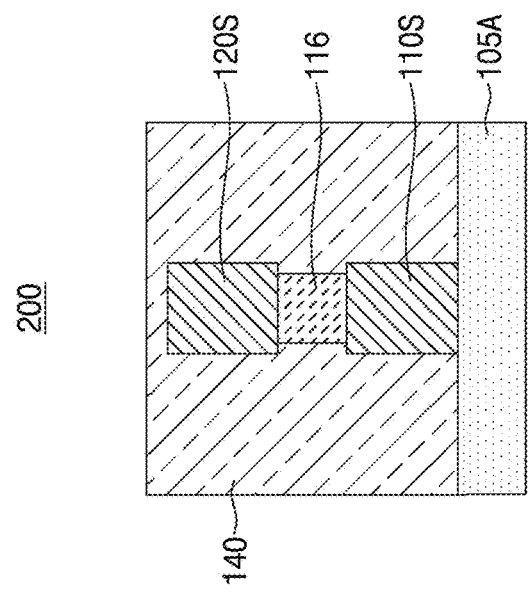
Figure 12B:
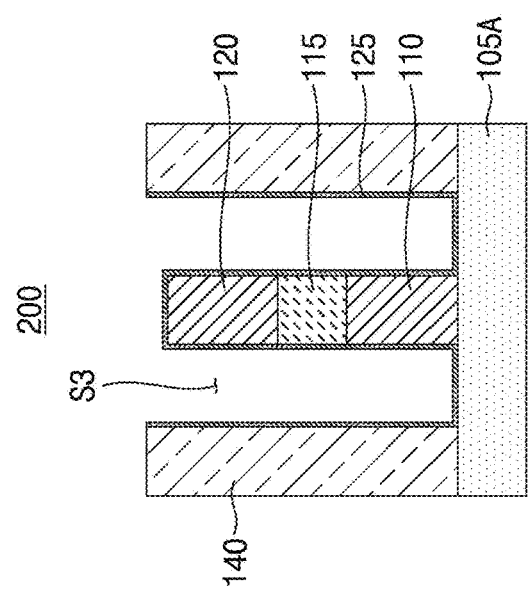
Figure 12A:
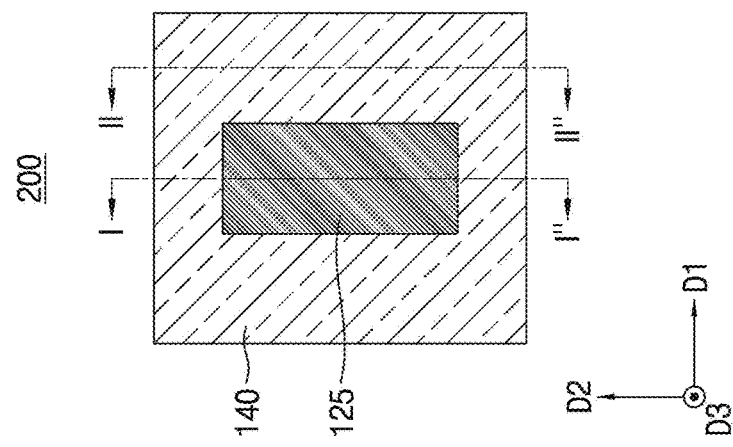

Referring to FIGS. 12A to 12C, a gate dielectric layer 125 is conformally formed by, for example, ALD along an inner surface of the $3^{rd}$ void space S3. Thus, the gate dielectric layer 125 surrounds the stack of the $1^{st}$ active region 110, the $1^{st}$ isolation layer 115 and the $2^{nd}$ active region 120, and is layered on a top surface of the $1^{st}$ substrate 105A and sidewalls of the ILD layer 140 exposed by the $3^{rd}$ void space S3.

The gate dielectric layer 125 may include the same interfacial layer and high-κ dielectric layer forming the $1^{st}$ gate dielectric layer 125-1 in the previous embodiment, and thus, the gate dielectric layer 125 may be formed of the same materials forming the $1^{st}$ gate dielectric layer 125-1. Accordingly, duplicate descriptions thereof are omitted herein.

In the previous embodiment as shown in FIGS. 4A to 4C, a gate dielectric layer, that is, the $1^{st}$ gate dielectric layer 125-1, is layered only on the $1^{st}$ active region 110, and then, another gate dielectric layer, that is, the $2^{nd}$ active region 120, is layered on the $2^{nd}$ active region 120 in a later step for the stacked semiconductor device 100. In the present embodiment, however, the gate dielectric layer 125 is formed to cover or surround both of the two active regions 110 and 120 by one time process to enable a follow-on step of one-time RPG process for the stacked semiconductor device 200. Also, one time process of forming the gate dielectric layer 125 in the present embodiment enables a more simplified manufacturing process of a stacked semiconductor device.

Figure 13C:
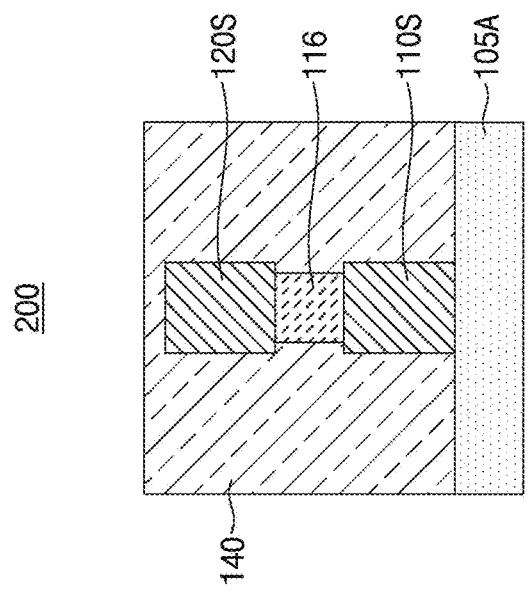
Figure 13B:
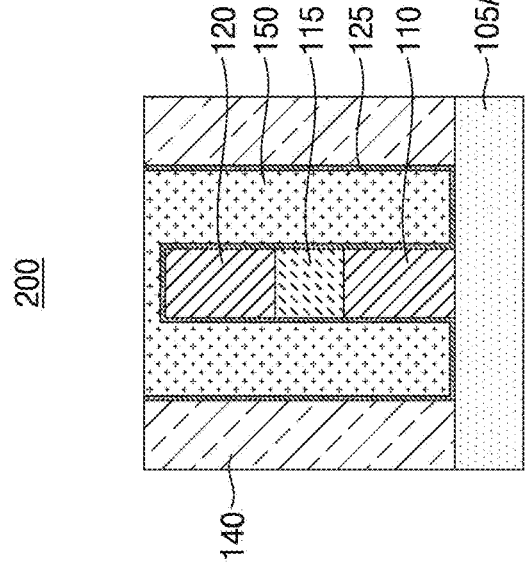
Figure 13A:
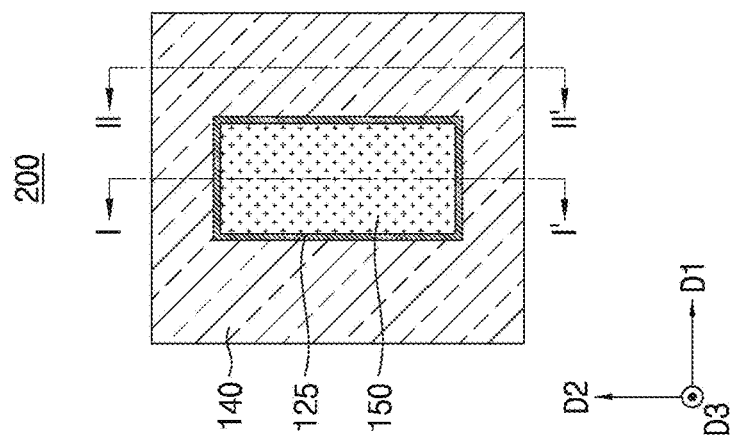

Referring to FIGS. 13A to 13C, an RPG structure 150 is filled in the $3^{rd}$ void space S3 on which the gate dielectric layer 125 is layered as shown in FIG. 12B. The RPG structure 150 is formed for annealing the gate dielectric layer 125 to increase reliability thereof in its functions described above.

Compared with the previous embodiment having two RPG formation processes for an upper stack transistor and a lower stack transistor of the stacked semiconductor device 100 as shown in FIGS. 5B and 8B, the present embodiment provides one RPG formation process for both of the upper-stack transistor and the lower-stack transistor of the stacked semiconductor device 200 as shown in FIG. 13B. As noted above, this one time RPG formation process along with one time formation of the gate dielectric layer 125 may be able to address oxide regrowth that may occur in manufacturing of a stacked semiconductor device.

Figure 13D:
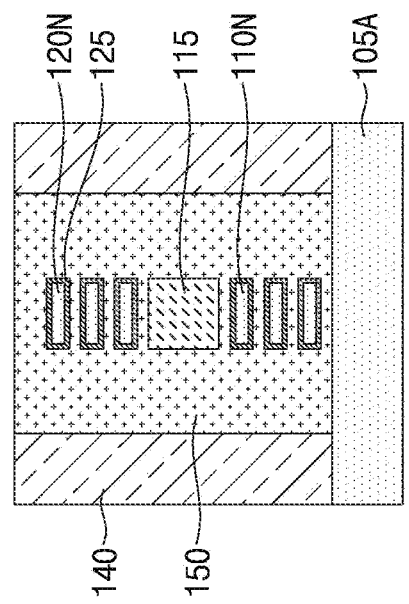

Meanwhile, FIG. 13B shows that the $1^{st}$ active region 110 contacts a top surface of the $1^{st}$ substrate 105A, and thus, the RPG structure 150 does not surround a bottom surface of the $1^{st}$ active region 110, while the RPG structure 150 does surround a top surface of the $2^{nd}$ active region 120. However, according to an embodiment in which each of the $1^{st}$ active region 110 and the $2^{nd}$ active region is formed of a plurality of nanosheet layers, the RPG structure 150 may be formed to surround the bottom surface of the $1^{st}$ active region 110, as shown in FIG. 13D. Referring to FIG. 13D, the gate dielectric layer 125 is layered on all outer surfaces of a plurality of $1^{st}$ nanosheet layers 110N and a plurality of $2^{nd}$ nanosheet layers 120N, and these nanosheet layers with the gate dielectric layer 125 thereon are surrounded by the RPG structure 150. In this embodiment, the gate dielectric layer 125 may not be layered on the top surface of the $1^{st}$ substrate 105 and the sidewalls of the ILD layer 140 exposed by the $3^{rd}$ void space S3 in the step of FIGS. 12A to 12C.

Figure 14C:
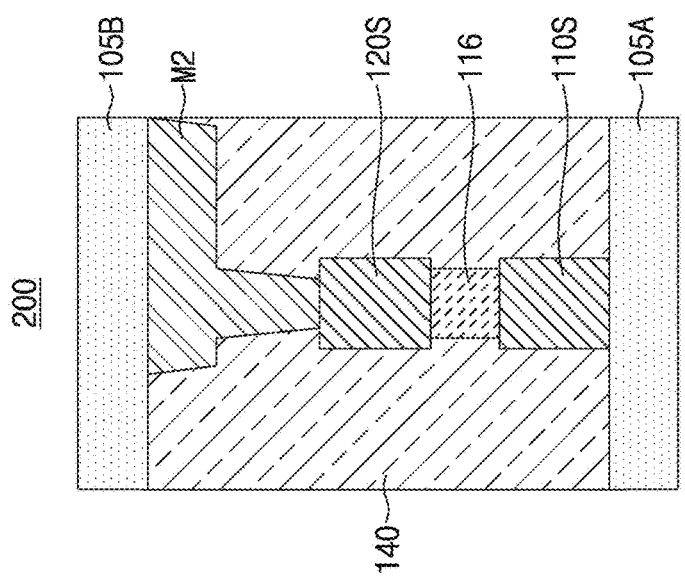
Figure 14B:
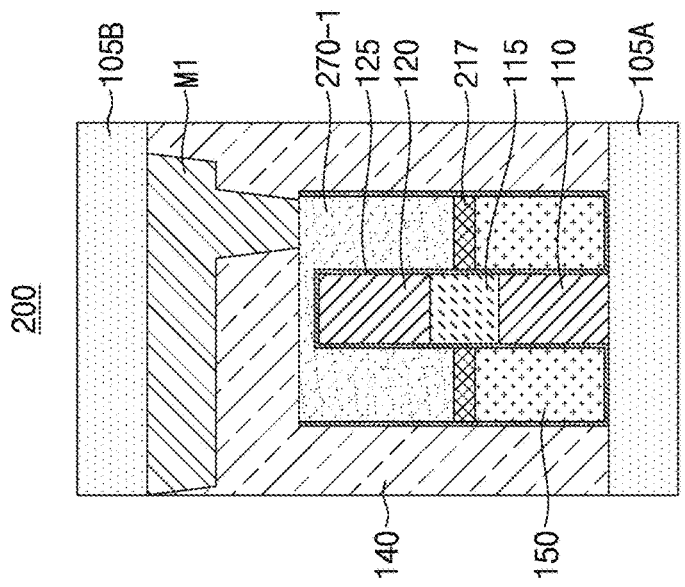
Figure 14A:
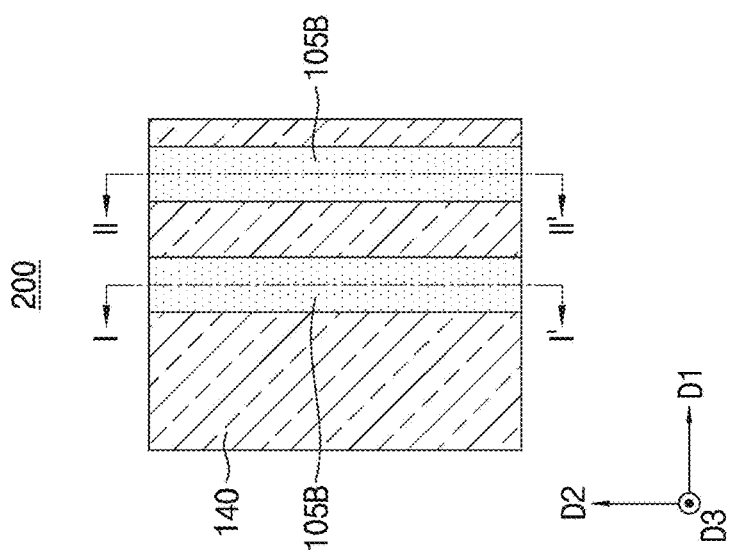

Referring to FIGS. 14A to 14C, an upper portion of the RPG structure 150 shown in FIGS. 13A and 13B is removed after annealing the gate dielectric layer 125. This operation of removing the upper portion of the RPG structure 150 may be performed by, for example, a dry etching, a wet etching, a reactive ion etching (RIE) and/or a chemical oxide removal (COR) process. And then, a $3^{rd}$ isolation layer 217 is formed on a top surface of the remaining RPG structure 150 in the $3^{rd}$ void space S3. Here, the upper portion of the RPG structure 150 is removed such that the $3^{rd}$ isolation layer 217 formed on the top surface of the remaining portion of the RPG structure 150 is layered at a level corresponding to a vertical middle portion of the $1^{st}$ isolation layer 115.

The $3^{rd}$ isolation layer 217 of the stacked semiconductor device 200 may be formed of the same or similar dielectric material forming the $3^{rd}$ isolation layer 117 of the stacked semiconductor device 100 of the previous embodiment as shown in FIGS. 3A and 3B. While the $3^{rd}$ isolation layer 117 of the stacked semiconductor device 100 is formed above the lower portion of the dummy gate structure 130 and between the $1^{st}$ isolation layer 115 and the ILD layer 140, the $3^{rd}$ isolation layer 217 of the stacked semiconductor device 200 is formed above a lower portion (remaining portion) of RPG structure 150 and between the gate dielectric layer 125 formed on the sidewalls of the ILD layer 140 in the $3^{rd}$ void space S3. Since the $3^{rd}$ isolation layer 217 is also formed for isolation of two gate structures to be formed to surround the two active region 110 and 120, respectively, in a later step, it may not be formed when these two gate structures are to be connected and include the same work function materials, for example for the same PMOS or NMOS.

After the $3^{rd}$ isolation layer 217 is layered, a $1^{st}$ RMG structure for a $1^{st}$ gate structure 270-1 is formed on the $3^{rd}$ isolation layer 217 so that the $1^{st}$ RMG and the $3^{rd}$ isolation layer 217 replaces the removed upper portion of the RPG structure 150 in the $3^{rd}$ void space S3 of the stacked semiconductor device 200. The $1^{st}$ RMG structure for the $1^{st}$ gate structure 270-1 may be formed of the same material as the $1^{st}$ RMG structure for the $1^{st}$ gate structure 170-1 of the stacked semiconductor device 100 of the previous embodiment shown in FIG. 6B, and thus, descriptions thereof are omitted.

Further, the same $1^{st}$ metal pattern M1, $2^{nd}$ metal pattern M2, and $2^{nd}$ substrate 105B shown in FIGS. 6A and 6B may be patterned above the $1^{st}$ gate structure 270-1 and the $2^{nd}$ source/drain region 120S, respectively, for the same purpose described above, as shown in FIGS. 14A and 14B. In addition, an additional ILD layer may be added to extend the ILD layer 140 to surround the $1^{st}$ metal pattern M1 and the $2^{nd}$ metal pattern M2.

Meanwhile, when the $1^{st}$ active region 110 and the $2^{nd}$ active region are formed of the plurality of $1^{st}$ nanosheet layers 110N and the plurality of $2^{nd}$ nanosheet layers 120N, the stacked semiconductor device 200 shown in FIG. 14B may take the structure shown in FIG. 14D, according to an embodiment.

Referring to FIGS. 15A to 15C, the stacked semiconductor device 200 shown in FIGS. 14A to 14C is flipped upside down, and the $1^{st}$ substrate 105A is removed, for example, by dry etching to expose the remaining portion of the RPG structure 150, that is not removed in the step of FIGS. 14A to 14C, the ILD layer 140 contacting the $1^{st}$ substrate 105A, and the $1^{st}$ source/drain regions 110S and 110D (not shown).

By this flipping operation, the stacked semiconductor device 200 also takes a form of a device formed on the $2^{nd}$ substrate 105B, and the $2^{nd}$ active region 120 and the $2^{nd}$ source/drain regions 120S and 120D are to form a lower-stack transistor of the stacked semiconductor device 100 while the $1^{st}$ active region 110 and the $1^{st}$ source/drain regions 110S and 110D are to form an upper-stack transistor of the stacked semiconductor device 200 in a later step.

Meanwhile, when the $1^{st}$ active region 110 and the $2^{nd}$ active region are formed of the plurality of $1^{st}$ nanosheet layers 110N and the plurality of $2^{nd}$ nanosheet layers 120N, the stacked semiconductor device 200 shown in FIG. 15B may take the structure shown in FIG. 15D, according to an embodiment.

Figure 16A:
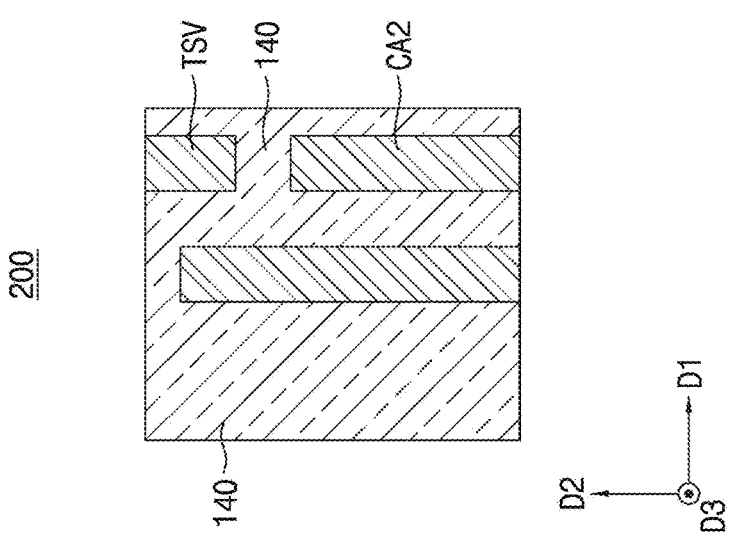

Referring to FIGS. 16A to 16C, the remaining portion of the RPG structure 150 is removed by the same process used to remove the upper portion of the RPG structure 150 in the step of FIGS. 14A to 14C, and a $2^{nd}$ RMG structure is formed on the $3^{rd}$ isolation layer 217 and between the gate dielectric layer 125, thereby forming a $2^{nd}$ gate structure 270-2. By this operation, the $2^{nd}$ gate structure 170-2 along with the $1^{st}$ source/drain regions 110S and 110D forms an upper-stack transistor of the stacked semiconductor device 200, and the $1^{st}$ gate structure 170-1 along with the $2^{nd}$ source/drain regions 120S and 120D forms a lower-stack transistor of the stacked semiconductor device 200.

The $2^{nd}$ RMG structure for the $2^{nd}$ gate structure 270-2 may include the same or different WFM such as from the $1^{st}$ RMG structure among Cu, Al, Ti, Ta, W, Co, TiN, WN, TiAl, TiAlN, TaN, TiC, TaC, TiAlC, TaCN, TaSiN, and/or a combination thereof, not being limited thereto. Again, when the $1^{st}$ RMC structure and the $2^{nd}$ RMG structure are formed of the same WFM, the $1^{st}$ gate structure 270-1 and the $2^{nd}$ gate structure 270-2 both may be a common gate structure for a p-type or n-type metal oxide semiconductor (PMOS or NMOS). In contrast, when the $1^{st}$ RMG structure and the $2^{nd}$ RMG structure are formed of different WFMs, one of the $1^{st}$ gate structure 270-1 and the $2^{nd}$ gate structure 270-2 may form one of a PMOS and an NMOS, and the other of the two gate structures 270-1 and 270-2 may form the other of the PMOS and the NMOS.

Further, the same $3^{rd}$ metal pattern M3 and $4^{th}$ metal pattern M4 and TSV shown in FIGS. 10A and 10B may be formed as shown in FIGS. 16A and 16B for the same purpose. It is noted again that, due to the above manufacturing method, the stacked semiconductor device 200 may take a form of a substantially mirror-symmetric structure in the vertical direction (D3 direction) as seen in FIG. 16B. For example, the $1^{st}$ active region 110 and the $2^{nd}$ gate structure 270-2 may be vertically mirror-symmetric to the $2^{nd}$ active region 120 and the $1^{st}$ gate structure 270-1, respectively, with respect to a virtual plane therebetween. In addition, an additional ILD layer may be added to extend the ILD layer 140 to surround the $3^{rd}$ metal pattern M3 and $4^{th}$ metal pattern M4 and TSV.

Figure 16D:
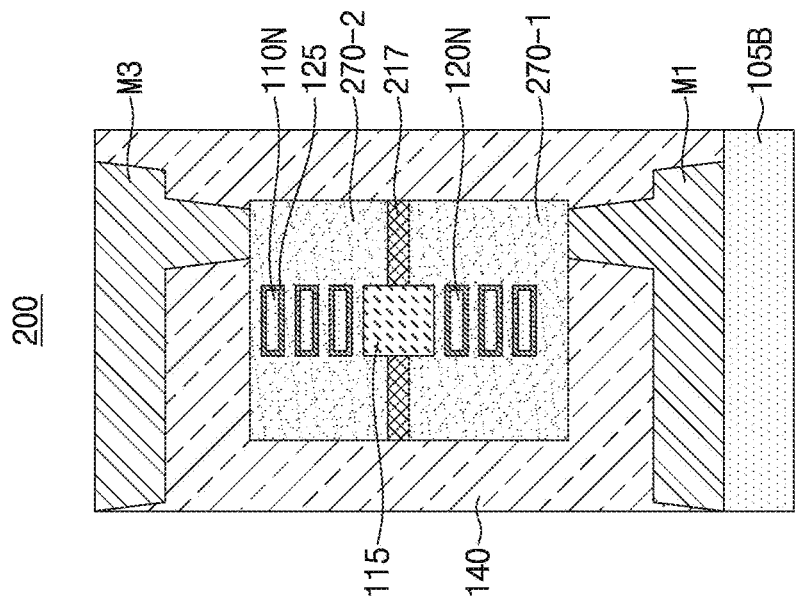

Meanwhile, when the $1^{st}$ active region 110 and the $2^{nd}$ active region are formed of the plurality of $1^{st}$ nanosheet layers 110N and the plurality of $2^{nd}$ nanosheet layers 120N, the stacked semiconductor device 200 shown in FIG. 15B may take the structure shown in FIG. 16D, according to an embodiment.

According to an embodiment, each of the upper-stack transistor including the $2^{nd}$ gate structure 270-2 and the lower-stack transistor including the $1^{st}$ gate structure 270-1 may be a PMOS nanosheet transistor or an NMOS nanosheet transistor. According to an embodiment, the upper-stack transistor and the lower-stack transistor may be a PMOS nanosheet transistor and an NMOS nanosheet transistor, respectively, or vice versa. According to an embodiment, each of the upper-stack transistor and the lower-stack transistor may be a p-type finFET or an n-type finFET. According to an embodiment, the upper-stack transistor and the lower-stack transistor may be a p-type finFET and an n-type finFET, respectively, or vice versa.

Figure 17:
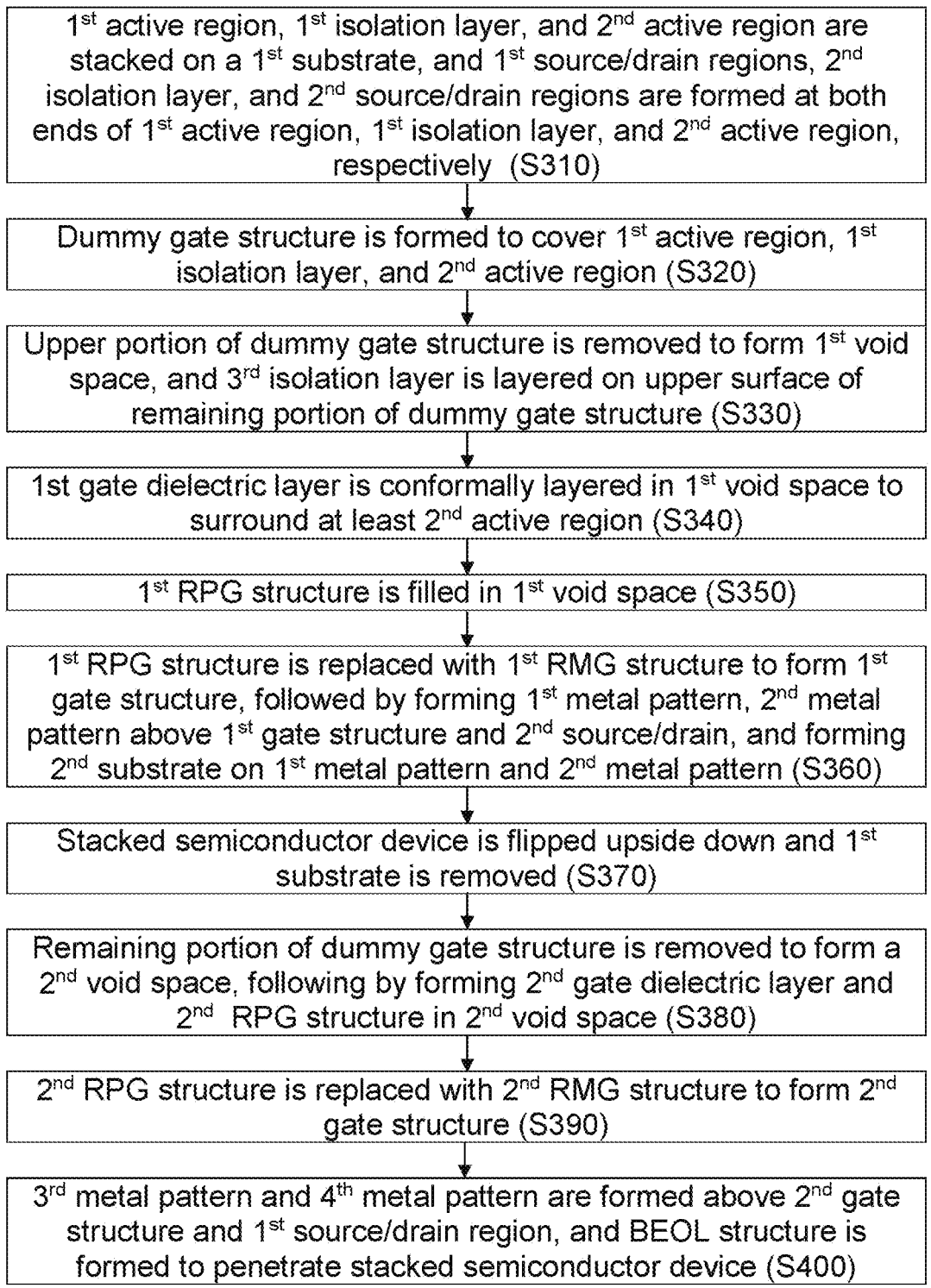
FIG. 17 illustrates a flowchart of forming a stacked semiconductor device in reference to FIGS. 1A to 1C through 10A to 10C, according to an embodiment.

FIG. 17 illustrates a flowchart of forming a stacked semiconductor device in reference to FIGS. 1A to 1C through 10A to 10C, according to an embodiment.

In operation 310, a $1^{st}$ active region, a $1^{st}$ isolation layer, and a $2^{nd}$ active region are stacked on a $1^{st}$ substrate, and $1^{st}$ source/drain regions, a $2^{nd}$ isolation layer, and $2^{nd}$ source/drain regions are formed at both ends of the $1^{st}$ active region, the $1^{st}$ isolation layer, and the $2^{nd}$ active region, respectively, to form a stacked semiconductor device, as shown in FIGS. 1A to 1C.

In operation 320, a dummy gate structure is formed to cover the $1^{st}$ active region, the $1^{st}$ isolation layer, and the $2^{nd}$ active region, as shown in FIGS. 2A to 2C.

In operation 330, an upper portion of the dummy gate structure is removed to form a $1^{st}$ void space having a bottom surface as a top surface of a remaining portion of the dummy gate structure, and a $3^{rd}$ isolation layer may be optionally layered on a top surface of a remaining portion of the dummy gate structure to have a vertical location corresponding to a vertical middle section of the $2^{nd}$ isolation layer, as shown in FIGS. 3A to 3C.

In operation 340, a $1^{st}$ gate dielectric layer is conformally layered in the $1^{st}$ void space, where the $2^{nd}$ isolation layer is layered at the bottom thereof, to surround at least the $2^{nd}$ active region, as shown in FIGS. 4A to 4C.

In operation 350, a $1^{st}$ RPG structure is filled in the $1^{st}$ void space for annealing the $1^{st}$ gate dielectric layer layered in the $1^{st}$ void space, as shown in FIGS. 5A to 5C. However, this process of RPG structure formation may be optional, and thus, may be omitted, according to an embodiment.

In operation 360, the $1^{st}$ RPG structure after annealing the $1^{st}$ gate dielectric layer is replaced with a $1^{st}$ RMG structure to form a $1^{st}$ gate structure of the stacked semiconductor device, followed by forming a $1^{st}$ metal pattern, a $2^{nd}$ metal pattern above the $1^{st}$ gate structure and the $2^{nd}$ source/drain region for respective connections thereto, and forming a $2^{nd}$ substrate on the $1^{st}$ metal pattern and the $2^{nd}$ metal pattern, as shown in FIGS. 6A to 6C.

In operation 370, the stacked semiconductor device is flipped upside down and the $1^{st}$ substrate is removed, by which the $2^{nd}$ substrate supports the stacked semiconductor device, and the $1^{st}$ active region and the $1^{st}$ source/drain regions are disposed above the $2^{nd}$ active region and the $2^{nd}$ source/drain regions with the $1^{st}$ isolation layer and the $2^{nd}$ isolation layer therebetween, respectively, as shown in FIGS. 7A to 7C.

In operation 380, the remaining portion of the dummy gate structure is removed to form a $2^{nd}$ void space, following by forming the $2^{nd}$ gate dielectric layer and the $2^{nd}$ RPG structure in the $2^{nd}$ void space, as shown in FIGS. 8A to 8C.

In operation 390, the $2^{nd}$ RPG structure is removed from the $2^{nd}$ void space and a $2^{nd}$ RMG structure is formed on the $2^{nd}$ gate dielectric layer in the $2^{nd}$ void space to form a $2^{nd}$ gate structure, thereby the $2^{nd}$ gate structure along with the $1^{st}$ source/drain regions forming an upper-stack transistor, and the $1^{st}$ gate structure along with the $2^{nd}$ source/drain regions forming a lower-stack transistor of the stacked semiconductor device, as shown in FIGS. 9A to 9C.

In operation 400, a $3^{rd}$ metal pattern and a $4^{th}$ metal pattern are formed above the $2^{nd}$ gate structure and the $1^{st}$ source/drain region for respective connections thereto, and a BEOL structure such as TSV is formed to penetrate the stacked semiconductor device so that the upper-stack transistor and the lower-stack transistor can be electrically connected to each other, as shown in FIGS. 10A to 10C.

Figure 18:
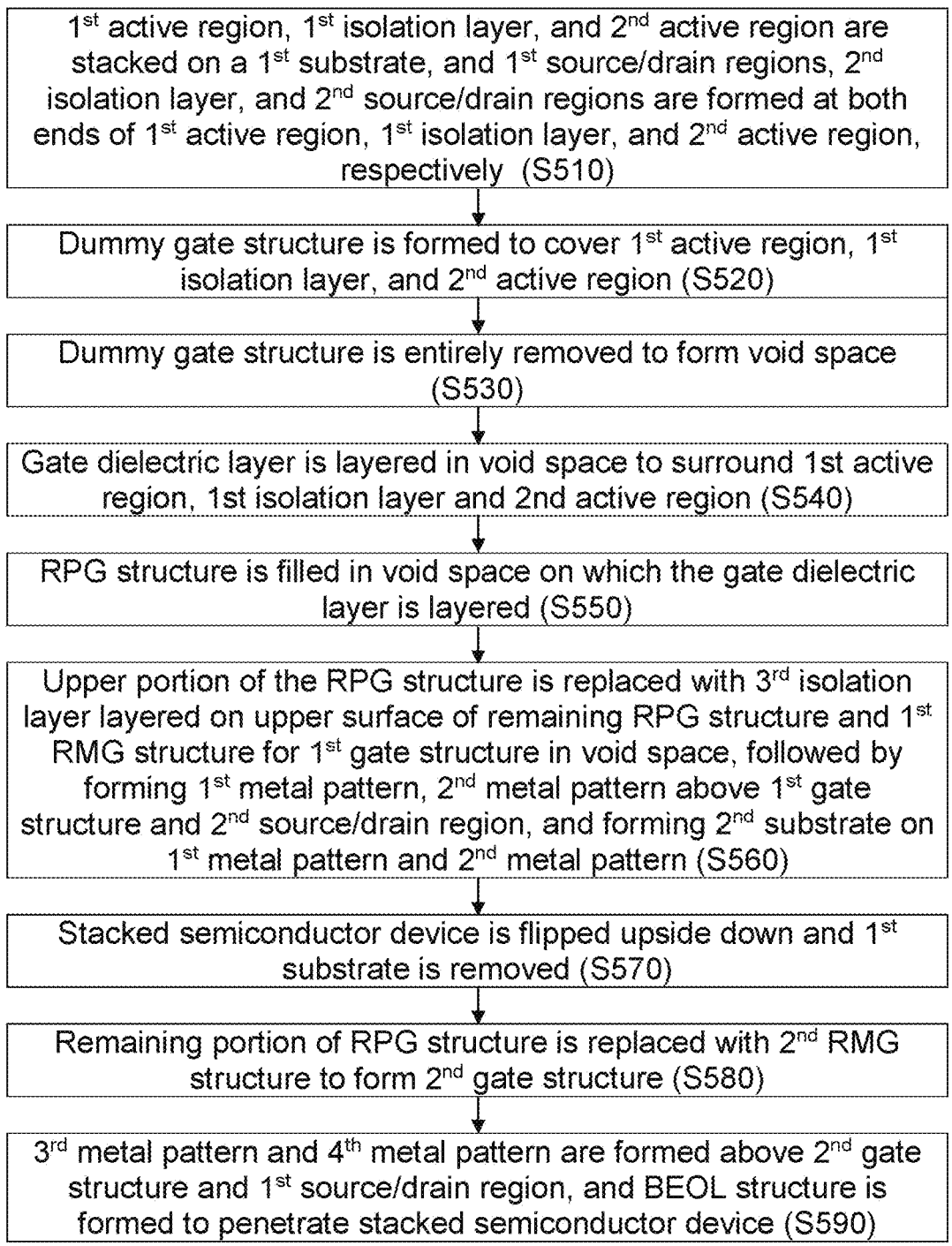
FIG. 18 illustrates a flowchart of forming a stacked semiconductor device in reference to FIGS. 1A to 1C, 2A to 2C and 11A to 11C through 16A to 16C, according to an embodiment.

FIG. 18 illustrates a flowchart of forming a stacked semiconductor device in reference to FIGS. 1A to 1C, 2A to 2C and 11A to 11C through 16A to 16C, according to an embodiment.

In operation 510, a $1^{st}$ active region, a $1^{st}$ isolation layer, and a $2^{nd}$ active region are stacked on a $1^{st}$ substrate, and $1^{st}$ source/drain regions, a $2^{nd}$ isolation layer, and $2^{nd}$ source/drain regions are formed at both ends of the $1^{st}$ active region, the $1^{st}$ isolation layer, and the $2^{nd}$ active region, respectively, to form a stacked semiconductor device as shown in FIGS. 1A to 1C.

In operation 520, a dummy gate structure is formed to cover the $1^{st}$ active region, the $1^{st}$ isolation layer, and the $2^{nd}$ active region, as shown in FIGS. 2A to 2C.

In operation 530, the dummy gate structure surrounding the $1^{st}$ active region and the $2^{nd}$ active region with the $1^{st}$ isolation layer therebetween is entirely removed to form a void space (the $3^{rd}$ void space S3 in FIG. 11B) in the stacked semiconductor device, as shown in FIGS. 11A to 11C.

In operation 540, a gate dielectric layer is conformally layered in the void space to surround the $1^{st}$ active region, the $1^{st}$ isolation layer and the $2^{nd}$ active region, as shown in FIGS. 12A to 12C.

In operation 550, an RPG structure is filled in the void space on which the gate dielectric layer is layered, as shown in FIGS. 13A to 13C.

In operation 560, an upper portion of the RPG structure is removed, a $3^{rd}$ isolation layer is formed on a top surface of the remaining RPG structure in the void space S3, and a $1^{st}$ RMG structure for a $1^{st}$ gate structure is formed on the $3^{rd}$ isolation layer 217 in the void space, followed by forming a $1^{st}$ metal pattern, a $2^{nd}$ metal pattern above the $1^{st}$ gate structure and the $2^{nd}$ source/drain region for respective connections thereto, and forming a $2^{nd}$ substrate on the $1^{st}$ metal pattern and the $2^{nd}$ metal pattern, as shown in FIGS. 14A to 14C. However, as discussed earlier, this process of RPG structure formation may be optional.

In operation 570, the stacked semiconductor device is flipped upside down and the $1^{st}$ substrate is removed, by which the $2^{nd}$ substrate supports the stacked semiconductor device, and the $1^{st}$ active region and the $1^{st}$ source/drain regions are disposed above the $2^{nd}$ active region and the $2^{nd}$ source/drain regions with the $1^{st}$ isolation layer and the $2^{nd}$ isolation layer therebetween, respectively, as shown in FIGS. 15A to 15C.

In operation 580, the remaining portion of the RPG structure is replaced with a $2^{nd}$ RMG structure to form a $2^{nd}$ gate structure, thereby the $2^{nd}$ gate structure along with the $1^{st}$ source/drain regions forming an upper-stack transistor, and the $1^{st}$ gate structure along with the $2^{nd}$ source/drain regions forming a lower-stack transistor of the stacked semiconductor device, as shown in FIGS. 16A to 16C.

In operation 590, a $3^{rd}$ metal pattern and a $4^{th}$ metal pattern are formed above the $2^{nd}$ gate structure and the $1^{st}$ source/drain region for respective connections thereto, and a BEOL structure such as TSV is formed to penetrate the stacked semiconductor device so that the upper-stack transistor and the lower-stack transistor can be electrically connected to each other, as also shown in FIGS. 16A to 16C.

Figure 19:
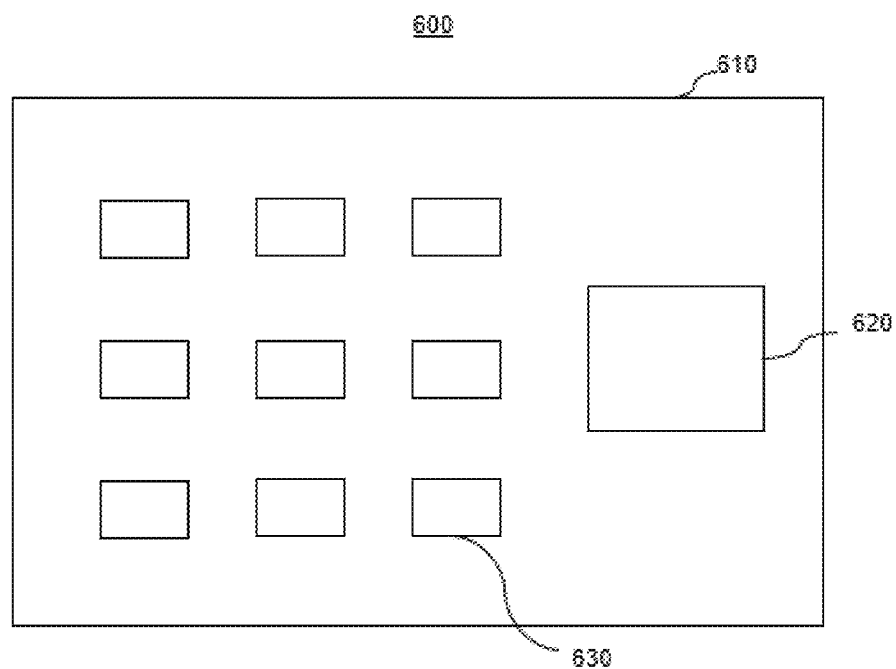
FIG. 19 illustrates a schematic plan view of a semiconductor module according to an embodiment.

FIG. 19 illustrates a schematic plan view of a semiconductor module according to an embodiment.

Referring to FIG. 19, a semiconductor module 600 according to an embodiment may include a processor 620 and semiconductor devices 630 that are mounted on a module substrate 610. The processor 620 and/or the semiconductor devices 630 may include one or more multi-stack nanosheet structures described in the above embodiments.

Figure 20:
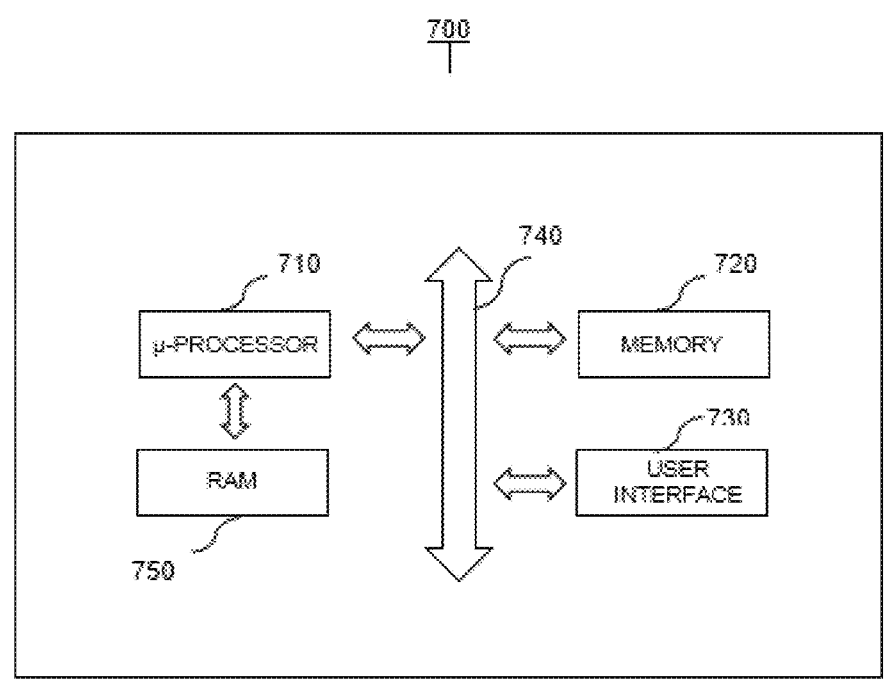
FIG. 20 illustrates a schematic block diagram of an electronic system according to an embodiment.

FIG. 20 illustrates a schematic block diagram of an electronic system according to an embodiment.

Referring to FIG. 20, an electronic system 700 in accordance with an embodiment may include a microprocessor 710, a memory 720, and a user interface 730 that perform data communication using a bus 740. The microprocessor 710 may include a central processing unit (CPU) or an application processor (AP). The electronic system 700 may further include a random access memory (RAM) 750 in direct communication with the microprocessor 710. The microprocessor 710 and/or the RAM 750 may be implemented in a single module or package. The user interface 730 may be used to input data to the electronic system 700, or output data from the electronic system 700. For example, the user interface 730 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 720 may store operational codes of the microprocessor 710, data processed by the microprocessor 710, or data received from an external device. The memory 720 may include a memory controller, a hard disk, or a solid state drive (SSD).

At least the microprocessor 710, the memory 720 and/or the RAM 750 in the electronic system 700 may include one or more stacked semiconductor device described in the above embodiments.

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A method of manufacturing a stacked semiconductor device, the method comprising:

providing a stacked semiconductor device comprising a $1^{st}$ substrate, a $1^{st}$ active region and $1^{st}$ source/drain regions on the $1^{st}$ substrate, and a $2^{nd}$ active region and $2^{nd}$ source/drain regions above the $1^{st}$ active region and the $1^{st}$ source/drain regions, respectively;

forming a dummy gate structure surrounding the $1^{st}$ active region and the $2^{nd}$ active region;

replacing an upper portion of the dummy gate structure with a $1^{st}$ gate dielectric layer, layered on outer surfaces of the $2^{nd}$ active region, and a $1^{st}$ replacement metal gate (RMG) structure to form a $1^{st}$ gate structure, thereby forming a lower-stack transistor;

forming a $2^{nd}$ substrate above the stacked semiconductor device;

flipping the stacked semiconductor device with the $2^{nd}$ substrate thereabove upside down so that a remaining portion of the dummy gate structure is disposed above the $1^{st}$ gate structure;

removing the $1^{st}$ substrate; and replacing the remaining dummy gate structure with a $2^{nd}$ gate dielectric layer, layered on outer surfaces of the $1^{st}$ active region, and a $2^{nd}$ RMG structure to form a $2^{nd}$ gate structure, thereby forming an upper-stack transistor.

2. The method of claim 1 further comprising:

forming a $1^{st}$ metal pattern connected to the $1^{st}$ gate structure;

forming a $2^{nd}$ metal pattern connected to at least one of the $2^{nd}$ source/drain regions;

forming a $3^{rd}$ metal pattern connected to the $2^{nd}$ gate structure;

forming a $4^{th}$ metal pattern connected to at least one of the $1^{st}$ source/drain regions; and forming an interconnect structure to which at least one of the $1^{st}$ source/drain regions and at least one of the $2^{nd}$ source/drain regions are connected.

3. A method of manufacturing a stacked semiconductor device, the method comprising:

providing a stacked semiconductor device comprising a $1^{st}$ substrate, a $1^{st}$ active region and $1^{st}$ source/drain regions on the $1^{st}$ substrate, and a $2^{nd}$ active region and $2^{nd}$ source/drain regions above the $1^{st}$ active region and the $1^{st}$ source/drain regions, respectively;

forming a dummy gate structure surrounding the $1^{st}$ active region and the $2^{nd}$ active region;

replacing the dummy gate structure with a gate dielectric layer, layered on outer surfaces of at least the $1^{st}$ active region and the $2^{nd}$ active region, and a $1^{st}$ replacement polysilicon metal gate (RPG) structure;

replacing an upper portion of the RPG structure with a $1^{st}$ replacement metal gate (RMG) structure to form a $1^{st}$ gate structure, thereby forming a lower-stack transistor;

forming a $2^{nd}$ substrate above the stacked semiconductor device;

flipping the stacked semiconductor device with the $2^{nd}$ substrate thereabove upside down so that a remaining portion of the RPG structure is disposed above the $1^{st}$ gate structure;

removing the $1^{st}$ substrate; and replacing the remaining RPG structure with a $2^{nd}$ RMG structure to form a $2^{nd}$ gate structure, thereby forming an upper-stack transistor.

4. The method of claim 3 further comprising:

forming a $1^{st}$ metal pattern connected to the $1^{st}$ gate structure;

forming a $2^{nd}$ metal pattern connected to at least one of the $2^{nd}$ source/drain regions;

forming a $3^{rd}$ metal pattern connected to the $2^{nd}$ gate structure;

forming a $4^{th}$ metal pattern connected to at least one of the $1^{st}$ source/drain regions; and forming an interconnect structure to which at least one of the $1^{st}$ source/drain regions and at least one of the $2^{nd}$ source/drain regions are connected.

* * * * *